United States Patent
Pilo et al.

(10) Patent No.: US 9,058,046 B1
(45) Date of Patent: Jun. 16, 2015

(54) LEAKAGE-AWARE VOLTAGE REGULATION CIRCUIT AND METHOD

(71) Applicant: International Business Machines Corporation, Armonk, NY (US)

(72) Inventors: Harold Pilo, Underhill, VT (US); Richard S. Wu, Winooski, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/107,267

(22) Filed: Dec. 16, 2013

(51) Int. Cl.
- G11C 5/14 (2006.01)
- G05F 3/26 (2006.01)
- G11C 11/4074 (2006.01)
- G11C 11/417 (2006.01)

(52) U.S. Cl.
CPC ............ G05F 3/267 (2013.01); G11C 11/4074 (2013.01); G11C 11/417 (2013.01)

(58) Field of Classification Search
USPC ..................................... 365/227, 228, 189.09
See application file for complete search history.

(56) References Cited

U.S. PATENT DOCUMENTS

| | | | |
|---|---|---|---|
| 5,434,534 A | 7/1995 | Lucas | |
| 5,532,578 A | 7/1996 | Lee | |
| 6,005,379 A | 12/1999 | Wong et al. | |
| 6,046,944 A | 4/2000 | Singh | |
| 6,204,722 B1 | 3/2001 | Maccarrone et al. | |
| 6,433,624 B1 | 8/2002 | Grossnickle et al. | |
| 6,809,968 B2 | 10/2004 | Marr et al. | |
| 7,268,614 B2 | 9/2007 | Jung | |
| 7,417,469 B2 | 8/2008 | Cheng et al. | |
| 7,787,284 B2 | 8/2010 | Chan et al. | |
| 8,004,924 B2 | 8/2011 | Leomant et al. | |
| 8,395,440 B2 | 3/2013 | Sandhu et al. | |
| 8,416,633 B2 | 4/2013 | Zampaglione et al. | |
| 8,829,883 B2 * | 9/2014 | Samid ............................ | 323/315 |
| 2010/0117720 A1 | 5/2010 | Valentian et al. | |
| 2012/0230126 A1* | 9/2012 | Ramaraju et al. ......... | 365/189.06 |
| 2012/0320700 A1 | 12/2012 | Lin et al. | |
| 2013/0170287 A1 | 7/2013 | Walsh et al. | |
| 2013/0188431 A1 | 7/2013 | Scheuerlein et al. | |

OTHER PUBLICATIONS

Kannan, et al., "Temperature and Process Variations aware Power Gating of Functional Units," 21st International Conference on VLSI Design, 2008.

(Continued)

Primary Examiner — Fernando Hidalgo
(74) Attorney, Agent, or Firm — Gibb & Riley, LLC; David A. Cain, Esq.

(57) ABSTRACT

A voltage regulation circuit and method where a pre-charge device (PCD) and a power gate device (PGD) are connected to a voltage line that supplies power to at least one additional device. The PCD pre-charges the line toward a supply voltage (Vdd) and PGD limits voltage changes on the voltage line caused by leakage current in the additional device(s) and does so differently under different leakage conditions. Specifically, the PGD is controlled by a variable reference voltage (Vref), which is closer to Vdd when a leakage condition is low relative to when the leakage condition is high. Since Vref is relatively high when the leakage condition is low and relatively low when the leakage condition is high, the power gate device will turn on after a smaller amount of voltage change on the voltage line when the leakage condition is low as compared to when the leakage condition is high.

20 Claims, 9 Drawing Sheets

(56) References Cited

OTHER PUBLICATIONS

Kim, et al., "A Process Variation Compensating Technique With an On-Die Leakage Current Sensor for Nanometer Scale Dynamic Circuits," 2006.

Tachibana, et al., "A 27% active and 85% standby Power Reduction in Dual-Power-Supply SRAM Using BL Power Calculator and Digitally Controllable Retention Circuit," Sold-State Circuits Conference Digest of Technical Papers (ISSCC), 2013 IEEE International, pp. 320-321, Feb. 17-21, 2013.

Okuma, et al., "0.5-V Input Digital LDO with 98.7% Current Efficiency and 2.7-uA Quiescent Current in 65nm CMOS," Custom Integrated Circuits Conference (CICC), 2010 IEEE, pp. 1-4, Sep. 19-22, 2010.

* cited by examiner

LEAKAGE-AWARE VOLTAGE REGULATION CIRCUIT AND METHOD

BACKGROUND

The circuits and methods disclosed herein relate to voltage regulation for integrated circuit devices and, more particularly, to leakage-aware voltage regulation for integrated circuit devices, such as memory devices.

More specifically, in some integrated circuit devices (e.g., memory devices, such as static random access memory (SRAM) devices, dynamic random access memory (DRAM) devices, etc.) and, particularly, in integrated circuit devices formed using fin-type field effect transistor (finFET) technologies, the leakage current can be directly proportional to the supply voltage. To minimize leakage current and, thereby minimize power consumption, oftentimes a traditional linear voltage regulation circuit will be incorporated into a device. A linear voltage regulation circuit will generate an adjusted supply voltage that is lower than the actual supply voltage by some fixed voltage amount (e.g., 100 mV, 200 mV, 300 mV, etc.). While such traditional linear voltage regulation circuits can provide for reduced power consumption, their effectiveness is limited in some integrated circuit devices and, particularly, in memory devices (e.g., SRAM devices, DRAM devices, etc.), which have a predetermined minimum supply voltage set to avoid memory cell failure (i.e., to minimize the chance that data stored in a memory cell will be lost).

SUMMARY

In view of the foregoing, disclosed herein are leakage-aware voltage regulation circuits and methods for integrated circuit devices and, particularly, for memory devices. In the circuits and methods, a pre-charge device and a power gate device can be electrically connected to a voltage line that supplies power to at least one additional device (e.g., one or more memory cells in a memory device). The pre-charge device can pre-charge the voltage line toward a supply voltage. After pre-charging, the power gate device can limit any voltage changes on the voltage line due to leakage current in the additional device(s) and can do so differently under different leakage conditions. Specifically, a leakage-aware variable first reference voltage (Vref1) can be generated such that it is closer to the supply voltage (i.e., relatively high) when a leakage condition is high as compared to when the leakage condition is low. Then, using Vref1 and the supply voltage, a leakage-aware variable second reference voltage (Vref2) can be generated such that it is closer to the supply voltage (i.e., relatively high) when the leakage condition is low as compared to when the leakage condition is high. The power gate device can be controlled by Vref2 so that it turns on when the actual voltage is less than the difference between Vref2 and the threshold voltage of the power gate device so as to limit voltage changes on the voltage line due to leakage current in the additional device(s). Since Vref2 is relatively high when the leakage condition is low and relatively low when the leakage condition is high, the power gate device will turn on after a smaller amount of voltage change on the voltage line when the leakage condition is low as compared to when the leakage condition is high. Optionally, the pre-charge device can be controlled by a leakage-aware pre-charge command signal to ensure that fluctuation of the voltage on the voltage line away from the supply voltage does not occur when the leakage condition is low and is only permitted when the leakage condition is high.

More particularly, disclosed herein is a leakage-aware voltage regulation circuit for an integrated circuit device and, particularly, for a memory device (e.g., a static random access memory (SRAM) device, a dynamic random access memory (DRAM) device, etc.). The circuit comprises a pair of reference voltage generators (i.e., a first reference voltage generator and a second reference voltage generator), a pre-charge device, and a voltage line.

The first reference voltage generator can generate a leakage-aware variable first reference voltage (Vref1) using a supply voltage (e.g., a positive supply voltage (Vdd)). This Vref1 can be generated such that it is closer to the supply voltage when the leakage condition is high as compared to when the leakage condition is low. That is, Vref1 can be generated such that it is relatively high and, particularly close to the supply voltage when the leakage condition is high and decreases as the leakage conditions decreases such that it is relatively low when the leakage condition is low.

The second reference voltage generator can generate a leakage-aware variable second reference voltage Vref2 using the supply voltage and Vref1. This Vref2 can be generated such that it is closer to the supply voltage when the leakage condition is low as compared to when the leakage condition is high. That is, contrary to Vref1, Vref2 can be generated such that it is relatively high and, particularly close to the supply voltage when the leakage condition is low and decreases as the leakage condition increases such that it is relatively low when the leakage condition is high.

The voltage line can be electrically connected to one or more additional devices (e.g., a memory cell or, more particularly, a bank of memory cells in the memory device) and can supply power to those additional device(s). The voltage line can further be electrically connected to both the pre-charge device and the power gate device. The pre-charge device can receive a digital pre-charge command signal and, particularly, can be controlled by a digital pre-charge command signal. Depending upon its logic value, this digital pre-charge command signal can cause the pre-charge device to turn on to pull the voltage line toward the supply voltage (i.e., to pre-charge the voltage line) or to turn off.

Following pre-charging of the voltage line and when the pre-charge device is turned off, the additional device(s) may, due to leakage current, pull the voltage line away from the supply voltage and the power gate device can limit voltage changes on the voltage line due to such leakage current and can do so differently under different leakage conditions. Specifically, the power gate device can receive and, particularly, can be controlled by Vref2 such that when the actual voltage on the voltage line is less than the difference between the variable second reference voltage and the threshold voltage of the power gate device, the power gate device will turn on, thereby limiting voltage changes on the voltage line due to leakage current in the additional device(s). Since Vref2 is relatively high when the leakage condition is low and relatively low when the leakage condition is high, the power gate device will turn on after a smaller amount of voltage change on the voltage line when the leakage condition is low as compared to when the leakage condition is high.

Disclosed herein is yet another leakage-aware voltage regulation circuit for an integrated circuit device and, particularly, for a memory device (e.g., a static random access memory (SRAM) device, a dynamic random access memory (DRAM) device, etc.). This circuit is similar to the voltage regulation circuit described above except that the pre-charge device is specifically controlled by a leakage-aware pre-charge command signal, which ensures that fluctuation of the voltage on the voltage line due to leakage current is only permitted when the leakage condition is high.

Specifically, this circuit comprises a pair of reference voltage generators (i.e., a first reference voltage generator and a second reference voltage generator), a pre-charge device, a power gate device, a voltage line, a digital signal generator and a logic gate.

The first reference voltage generator can generate a leakage-aware variable first reference voltage (Vref1) using a supply voltage (e.g., a positive supply voltage (Vdd)). This Vref1 can be generated such that it is closer to the supply voltage when the leakage condition is high as compared to when the leakage condition is low. That is, Vref1 can be generated such that it is relatively high and, particularly close to the supply voltage when the leakage condition is high and decreases as the leakage conditions decreases such that it is relatively low when the leakage condition is low.

The second reference voltage generator can generate a leakage-aware variable second reference voltage Vref2 using the supply voltage and Vref1. This Vref2 can be generated such that it is closer to the supply voltage when the leakage condition is low as compared to when the leakage condition is high. That is, contrary to Vref1, Vref2 can be generated such that it is relatively high and, particularly close to the supply voltage when the leakage condition is low and decreases as the leakage condition increases such that it is relatively low when the leakage condition is high.

The digital signal generator can generate a digital leakage condition indicator signal using the supply voltage and Vref1. Specifically, the digital signal generator can generate a digital leakage condition indicator signal that it has a first logic value (e.g., a logic "0" value) when the leakage condition is high and a second logic value (e.g., a logic "1" value) when the leakage condition is low.

The logic gate (e.g., a NOR logic gate) can receive, as inputs, the leakage condition indicator signal and a digital first pre-charge command signal and can output a digital second pre-charge command signal.

The voltage line can be electrically connected to one or more additional devices (e.g., a memory cell or, more particularly, a bank of memory cells in the memory device) and can supply power to those additional device(s). The voltage line can further be electrically connected to both the pre-charge device and the power gate device. The pre-charge device can receive the digital second pre-charge command signal from the logic gate and, particularly, can be controlled by that digital second pre-charge command signal. Depending upon its logic value, this digital second pre-charge command signal can cause the pre-charge device to turn on to pull the voltage line toward the supply voltage (i.e., to pre-charge the voltage line) or to turn off. This will occur when the digital first pre-charge command signal commands pre-charging of the voltage line during any leakage condition and also when the leakage condition indicator signal indicates that the leakage condition is low (e.g., when the logic gate is a NOR logic gate and the digital first pre-charge command signal has a logic "1" value and/or the leakage condition indicator signal has a logic "1" value).

Following pre-charging of the voltage line and when the pre-charge device is turned off, the additional device(s) may, due to leakage current, pull the voltage line away from the supply voltage and the power gate device can limit the voltage changes on the voltage line due to such leakage current and can do so differently under different leakage conditions. Specifically, the power gate device can receive and, particularly, can be controlled by Vref2 such that when the actual voltage on the voltage line is less than the difference between the variable second reference voltage and the threshold voltage of the power gate device, the power gate device will turn on, thereby limiting voltage changes on the voltage line due to leakage current in the additional device(s). Since Vref2 is relatively high when the leakage condition is low and relatively low when the leakage condition is high, as the leakage condition increases so will the amount of voltage change required before the power gate device will turn on. Furthermore, since the voltage line is always pre-charged when the leakage condition is low, no fluctuation of the voltage on the voltage line away from the supply voltage will be permitted when the leakage condition is low (i.e., the voltage on the voltage line can only be pulled away from the supply voltage due to leakage current when the leakage condition is high).

Also disclosed herein are voltage regulation methods associated with the above-described circuits. Specifically, the voltage regulation methods can comprise providing a voltage regulation circuit, such as one of the circuits described above.

The method can further comprise generating, by a first reference voltage generator in a voltage regulation circuit, a leakage-aware variable first reference voltage (Vref1) using a supply voltage (e.g., a positive supply voltage (Vdd)). This Vref1 can be generated such that it is closer to the supply voltage when the leakage condition is high as compared to when the leakage condition is low. That is, Vref1 can be generated such that it is relatively high and, particularly close to the supply voltage when the leakage condition is high and decreases as the leakage conditions decreases such that it is relatively low when the leakage condition is low.

The method can further comprise generating, by a second reference voltage generator in a voltage regulation circuit, a leakage-aware variable second reference voltage Vref2 using the supply voltage and Vref1. This Vref2 can be generated such that it is closer to the supply voltage when the leakage condition is low as compared to when the leakage condition is high. That is, contrary to Vref1, Vref2 can be generated such that it is relatively high and, particularly close to the supply voltage when the leakage condition is low and decreases as the leakage condition increases such that it is relatively low when the leakage condition is high.

The method can further comprise controlling a pre-charge device in the voltage regulation circuit using a digital pre-charge command signal. Specifically, depending upon its logic value, this digital pre-charge command signal can cause the pre-charge device to turn on and pre-charge a voltage line toward the supply voltage (i.e., to pull the voltage line toward the supply voltage) or to turn off. Following pre-charging of the voltage line and when the pre-charge device is turned off, the voltage line can be pulled away from the supply voltage due to leakage current in one or more additional device(s) that are powered by the voltage line.

The method can comprise controlling a power gate device of the voltage regulation circuit using Vref2. Specifically, Vref2 can control the power gate device and, particularly, can cause the power gate device to turn on when the actual voltage on the voltage line is less than the difference between Vref2 and the threshold voltage of the power gate device, thereby limiting voltage changes on the voltage line due to leakage current in the additional device(s). Since Vref2 is relatively high when the leakage condition is low and relatively low when the leakage condition is high, the power gate device will turn on after a smaller amount of voltage change on the voltage line when the leakage condition is low as compared to when the leakage condition is high.

It should be noted that, optionally, the method can further comprising generating the pre-charge command signal such that it is leakage-aware and, particularly, such that the pre-charge device will turn on to pull the voltage line toward the supply voltage whenever the leakage condition is low and, thereby such that the actual voltage on the voltage line can only be pulled away from the supply voltage by the additional device(s) when the leakage condition is high and, thus, the power gate device can only turn on when the leakage condition is high.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
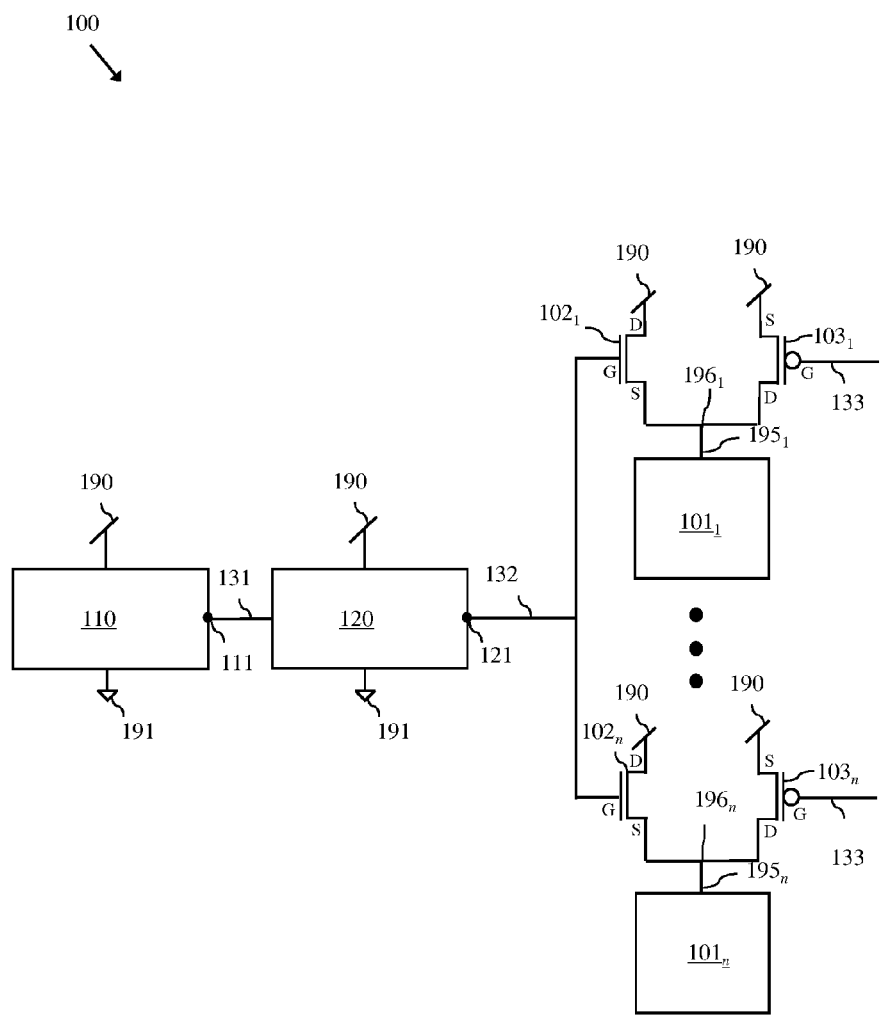
FIG. 1 is a schematic drawing illustrating a leakage-aware voltage regulation circuit.

As mentioned above, in some integrated circuit devices (e.g., memory devices, such as static random access memory (SRAM) devices, dynamic random access memory (DRAM) devices, etc.) and, particularly, in integrated circuit devices formed using fin-type field effect transistor (finFET) technologies, the leakage current can be directly proportional to the supply voltage. To minimize leakage current and, thereby minimize power consumption, oftentimes a traditional linear voltage regulation circuit will be incorporated into a device. A linear voltage regulation circuit will generate an adjusted supply voltage that is lower than the actual supply voltage by some fixed voltage amount (e.g., 100 mV, 200 mV, 300 mV, etc.). While such traditional linear voltage regulation circuits can provide for reduced power consumption, their effectiveness is limited in some integrated circuit devices and, particularly, in memory devices (e.g., SRAM devices, DRAM devices, etc.), which have a predetermined minimum supply voltage set to avoid memory cell failure (i.e., to minimize the chance that data stored in a memory cell will be lost).

In view of the foregoing, disclosed herein are leakage-aware voltage regulation circuits and methods for integrated circuit devices and, particularly, for memory devices. In the circuits and methods, a pre-charge device and a power gate device can be electrically connected to a voltage line that supplies power to at least one additional device (e.g., one or more memory cells in a memory device). The pre-charge device can pre-charge the voltage line toward a supply voltage. After pre-charging, the power gate device can limit any voltage changes on the voltage line due to leakage current in the additional device(s) and can do so differently under different leakage conditions. Specifically, a leakage-aware variable first reference voltage (Vref1) can be generated such that it is closer to the supply voltage (i.e., relatively high) when a leakage condition is high as compared to when the leakage condition is low. Then, using Vref1 and the supply voltage, a leakage-aware variable second reference voltage (Vref2) can be generated such that it is closer to the supply voltage (i.e., relatively high) when the leakage condition is low as compared to when the leakage condition is high. The power gate device can be controlled by Vref2 so that it turns on when the actual voltage is less than the difference between Vref2 and the threshold voltage of the power gate device so as to limit voltage changes on the voltage line due to leakage current in the additional device(s). Since Vref2 is relatively high when the leakage condition is low and relatively low when the leakage condition is high, the power gate device will turn on after a smaller amount of voltage change on the voltage line when the leakage condition is low as compared to when the leakage condition is high. Optionally, the pre-charge device can be controlled by a leakage-aware pre-charge command signal to ensure that fluctuation of the voltage on the voltage line away from the supply voltage does not occur when the leakage condition is low and is only permitted when the leakage condition is high.

Figure 2:
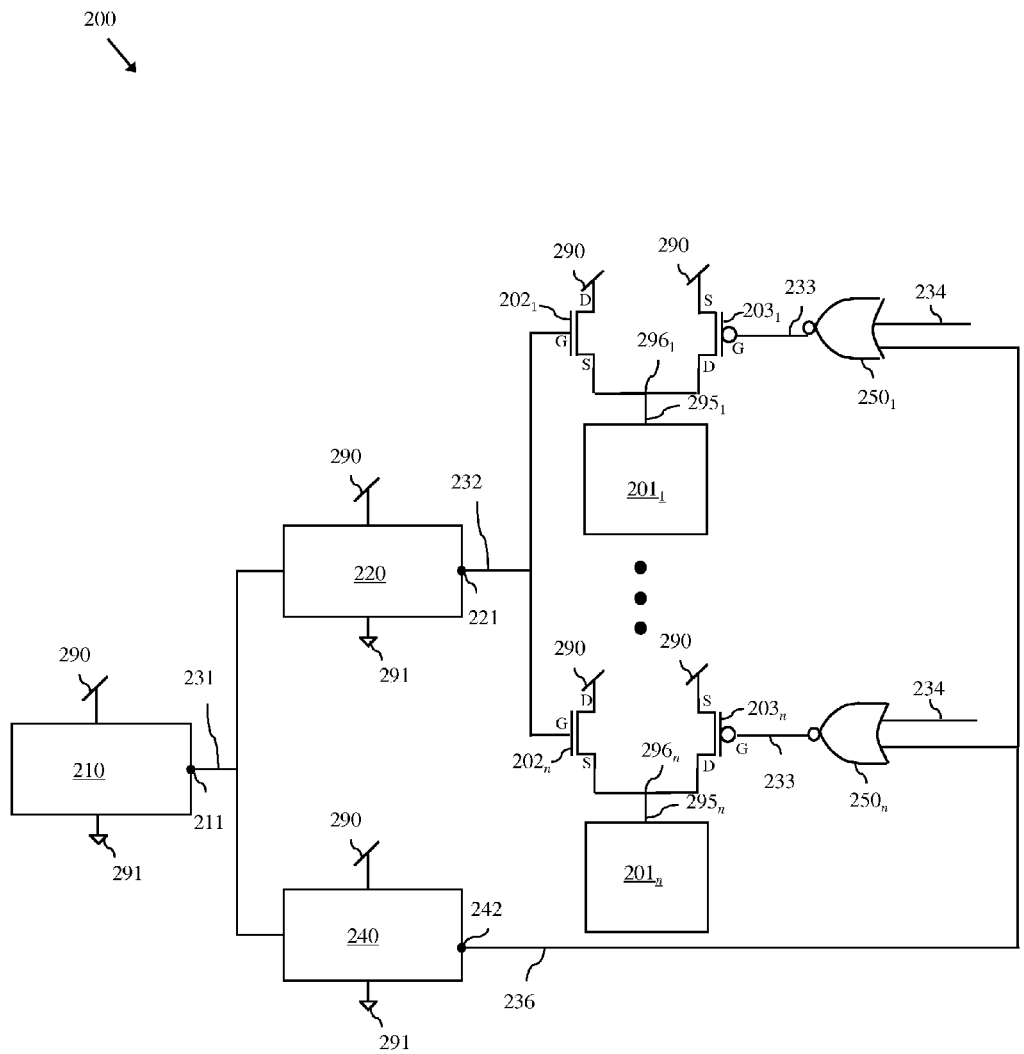
FIG. 2 is a schematic drawing illustrating another leakage-aware voltage regulation circuit.

More particularly, referring to the schematic diagrams of FIGS. 1 and 2, disclosed herein are voltage regulation circuits 100, 200 for an integrated circuit device requiring voltage regulation. The integrated circuit device can comprise, for example, a memory device (e.g., a static random access memory (SRAM) device, a dynamic random access memory (DRAM) device, etc.) requiring voltage regulation on voltage line(s) $195_{1-n}$, $295_{1-n}$ that power memory cells $101_{1-n}$, $201_{1-n}$ (e.g., SRAM cells, DRAM cells, etc.) or, more particularly, that power banks of memory cells. Alternatively, the integrated circuit device can comprise any other type of integrated circuit device requiring voltage regulation on voltage line(s).

The voltage regulation circuits 100, 200 can each comprise a power supply that generates a supply voltage 190, 290 (e.g., a positive supply voltage (Vdd)). Power supplies are well known in the art and, thus, the details of such power supplies are omitted from this specification in order to allow the reader to focus on the salient aspects of the disclosed circuits.

The voltage regulation circuits 100, 200 can each further comprise a pair of reference voltage generators (i.e., a first reference voltage generator 110, 210 and a second reference voltage generator 120, 220). The first reference voltage generator 110, 210 can generate a variable first reference voltage (Vref1) 131, 231 at a first output node 111, 211 using the supply voltage 190, 290. This variable first reference voltage 131, 231 can be a leakage-aware variable first reference voltage (i.e., can be dependent upon leakage current) such that, as the leakage current increases, the variable first reference voltage 131, 231 will be pulled toward the supply voltage 190, 290. Specifically, this variable first reference voltage 131, 231 can be generated such that it is closer to the supply voltage 190, 290 when the leakage condition is high as compared to when the leakage condition is low. That is, the variable first reference voltage 131, 231 can be generated such that it is relatively high and, particularly close to the supply voltage when the leakage condition is high and decreases as the leakage conditions decreases such that it is relatively low when the leakage condition is low. Thus, this variable first reference voltage 131, 231 will be similar to a proportional to absolute temperature (PTAT) voltage reference with the added feature of further taking into account process variations.

It should be understood that, for purposes of this disclosure, a leakage condition refers to a condition which impacts leakage current. Those skilled in the art will recognize that this condition is created as a function of both operating temperature and process variations. For example, leakage current increases with increasing operating temperature and decreases with decreasing operating temperature. Additionally, different process corners also impact leakage current. For example, a fast-fast (FF) process corner will typically result in a greater amount of leakage current than a typical-typical (TT) process corner and a TT process corner will typically result in a greater amount of leakage current than a slow-slow (SS) process corner.

The second reference voltage generator 120, 220 can be electrically connected to the first output node 111, 211 and can generate a variable second reference voltage (Vref2) 132, 232 at a second output node 121, 221 using the supply voltage 190, 290 and the variable first reference voltage 131, 231. This variable second reference voltage 132, 232 can be a leakage-aware variable second reference voltage (i.e., can be dependent upon leakage current) such that, as the leakage current decreases, the variable second reference voltage 132, 232 will be pulled toward the supply voltage 190, 290. Specifically, this variable second reference voltage 132, 232 can be generated such that it is closer to the supply voltage when the leakage condition is low as compared to when the leakage condition is high. That is, contrary to the variable first reference voltage 131, 231, the variable second reference voltage 132, 232 can be generated such that it is relatively high and, particularly close to the supply voltage when the leakage condition is low and decreases as the leakage condition increases such that it is relatively low when the leakage condition is high. Thus, this variable second reference voltage 132, 232 will be similar to a complementary to absolute temperature (CTAT) voltage reference with the added feature of further taking into account process variations.

Figure 3:
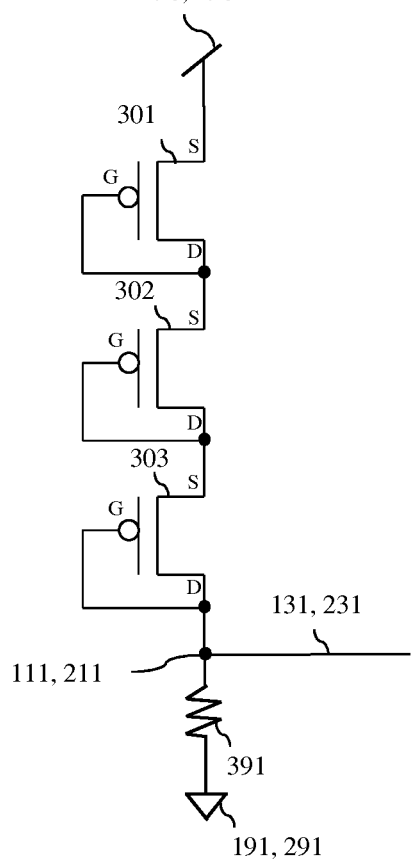
FIG. 3 is a schematic drawing illustrating an exemplary first reference voltage generator that can be incorporated into the voltage regulation circuits of FIGS. 1 and 2.

For example, FIG. 3 is a schematic diagram illustrating an exemplary first reference voltage generator 110, 210 that can be incorporated into the voltage regulation circuits 100, 200 of FIGS. 1 and 2, respectively. This first reference voltage generator 110, 210 can comprise one or more field effect transistor 301-303 electrically connected in series between the power supply 190, 290 and the first output node 111, 211. The first reference voltage generator 110, 210 can further comprise a resistor 391 electrically connected between said first output node 111, 211 and ground 191, 291.

In any case, each of the field effect transistors 301-303 can have, for example, a first type conductivity. For example, the field effect transistors 301-303 can have a P-type conductivity (i.e., they can be P-type field effect transistors (PFETs)). Additionally, each of the field effect transistors 301-303 can be diode-connected. That is, their respective drains can be electrically connected to the gates. In such a first reference voltage generator 110, 210, when leakage conditions are low (e.g., as a function of a low operating temperature or a slow-slow (SS) process variation), the threshold voltages of the field effect transistors 301-303 will be relatively high. Thus, the variable first reference voltage 131, 231 at the first output node 111, 211 will be relatively low (i.e., significantly less that the supply voltage 190, 290). However, when leakage conditions are high (e.g., as a function of a high operating temperature or a fast-fast (FF) process condition), the threshold voltages of the field effect transistors 301-303 will be relatively small and the variable first reference voltage 131, 231 at the first output node 111, 211 will be relatively high (i.e., nearer the supply voltage 190, 290). That is, the variable first reference voltage 131, 231 will be essentially linear and leakage-dependent such that, as the leakage current decreases (e.g., as a function of a low operating temperature, etc.), the variable first reference voltage 131, 231 will be pulled-down away from the supply voltage 190, 290 and such that, as the leakage current increases (e.g., as a function of a high operating temperature, etc.), the variable first reference voltage 131, 231 will be pulled-up toward the supply voltage 190, 290.

Figure 4A:
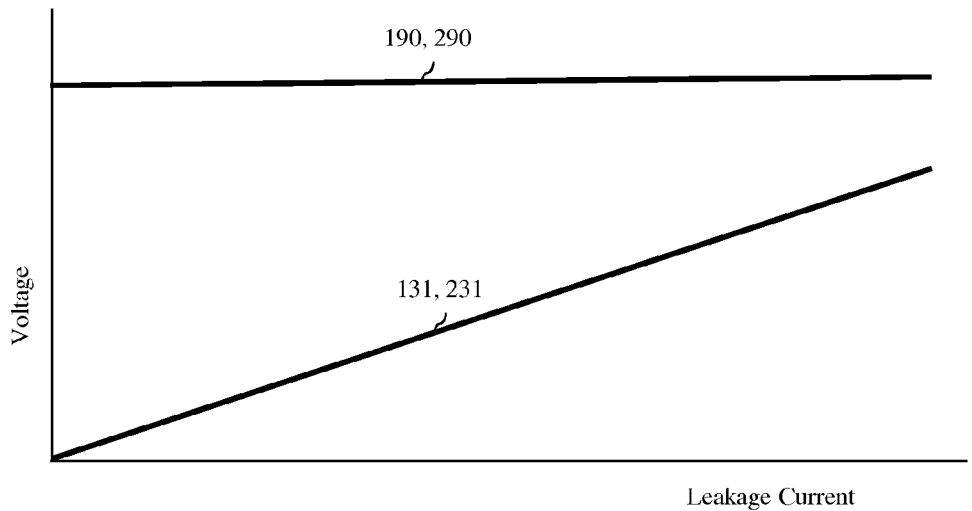
FIG. 4A is a graph illustrating an exemplary variable first reference voltage that can be generated by the first reference voltage generator of FIG. 3.

FIG. 4A is a graph illustrating an exemplary variable first reference voltage 131, 231 generated by the first reference voltage generator 110, 210 based on a given supply voltage and, specifically, illustrating the linear relationship between the voltage amount and leakage current.

Figure 4B:
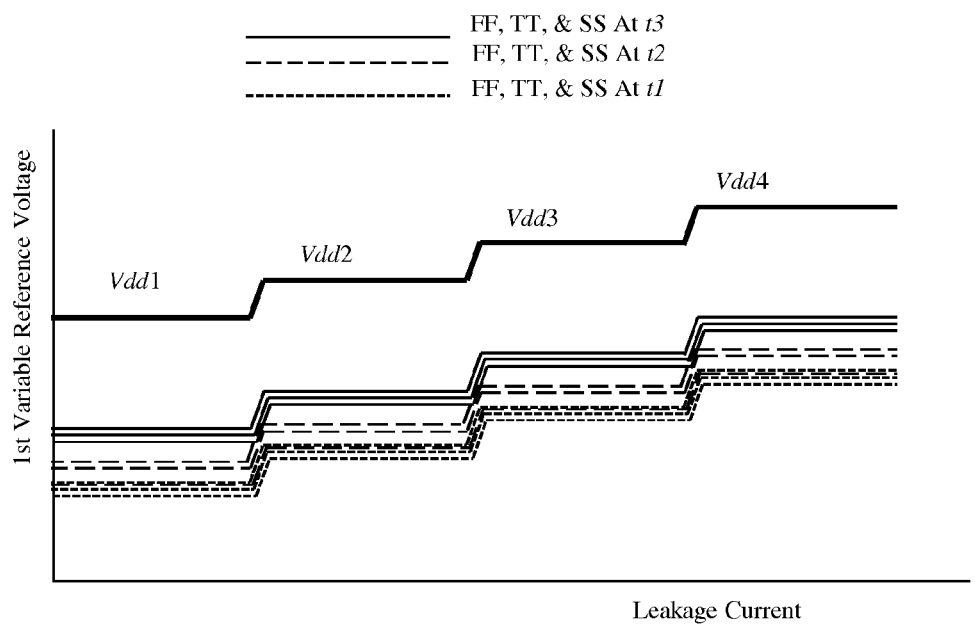
FIG. 4B is a graph illustrating differences in variable first reference voltages generated at different supply voltages Vdd1-Vdd4.

It should be noted that, optionally, the voltage regulation circuit 100, 200 can comprise a variable power supply (not shown) that can generate a supply voltage 190, 290 that is selectively variable between at least a low supply voltage and a high supply voltage that is greater than the low supply voltage. FIG. 4B is a graph illustrating the variable first reference voltage 131, 231 that can be generated by the first reference voltage generator 110, 210 at different supply voltages Vdd1-Vdd4 (e.g., if a supply voltage generator which supplies the supply voltage allows for the generation of multiple different supply voltages) under different leakage conditions. In this graph, each line represents one of three different exemplary operating temperatures t1-t3, where t1 is less than t2, and t2 is less than t3, and one of three different process corners (e.g., fast-fast (FF), typical-typical (TT) and slow-slow (SS)). As illustrated, at the highest leakage conditions and, particularly, at the FF process corner and highest operating temperature t3, the variable first reference voltage 131, 231 will be relatively high; whereas at the lowest leakage conditions and, particularly, at the SS process corner and lowest operating temperature t1, the variable first reference voltage 131, 231 will be relatively low for any given supply voltage Vdd1-Vdd4.

It should be noted that, for purposes of illustration, the first reference voltage generator 110, 210 is shown in FIG. 3 as having three diode-connected field effect transistors 301-303. However, it should be understood that FIG. 3 is not intended to be limiting and that, alternatively, the first reference voltage generator 110, 210 can comprise any number of one or more diode-connected field effect transistors. Those skilled in the art will recognize that the number and sizes of the diode-connected field effect transistors can be pre-selected to achieve the desired variable first reference voltage swing between high and low leakage conditions at the first output node 111, 211.

Another exemplary first reference voltage generator 110, 210 that can be incorporated in the voltage regulation circuits 100, 200 can have a configuration similar to that shown in FIG. 3, except that the diode-connected field effect transistor(s) 301-303 can be replaced by simple diodes. Those skilled in the art will recognize that the number and sizes of the diodes can be pre-selected to achieve the desired variable first reference voltage swing between high and low leakage conditions at the first output node 111, 211.

Figure 5:
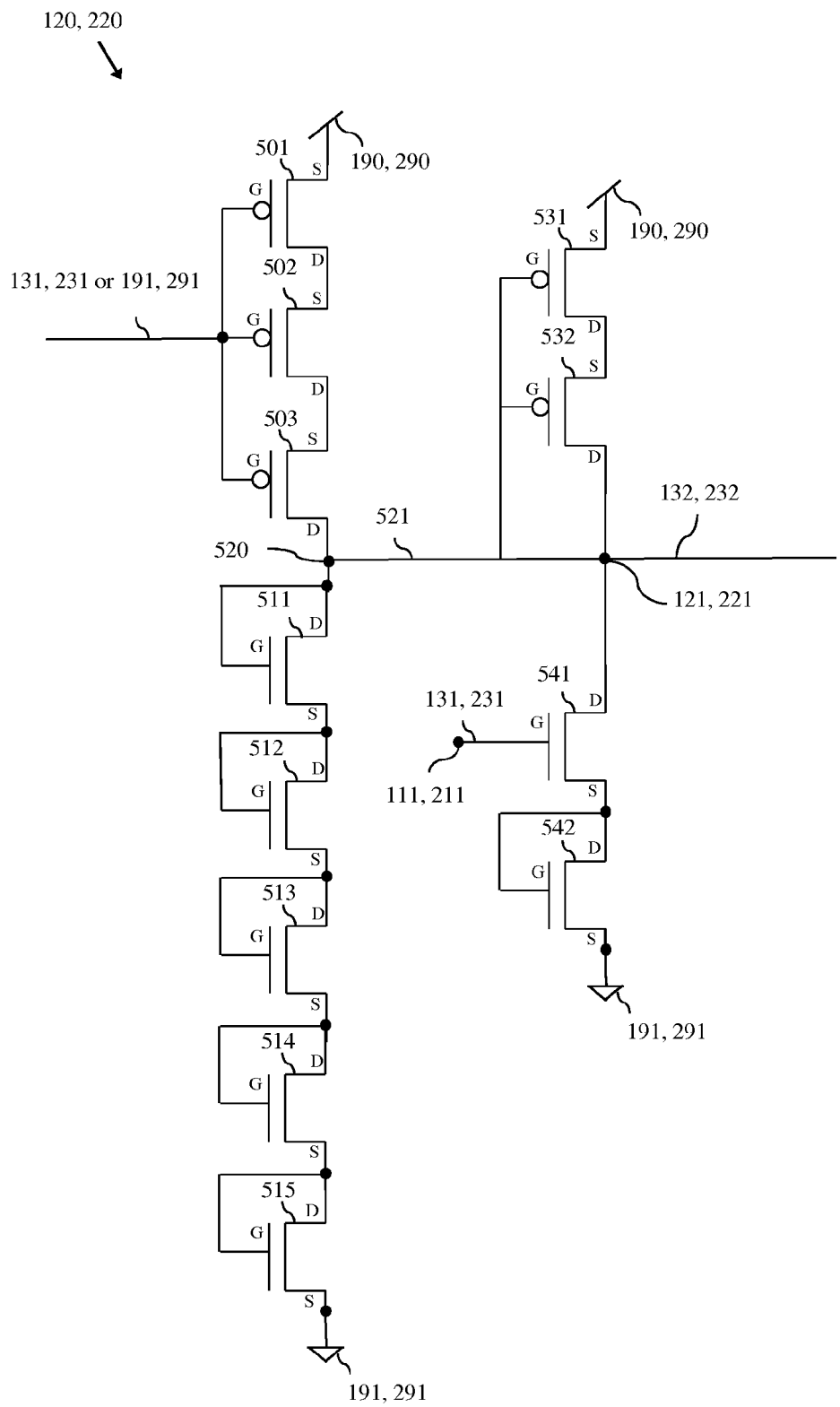
FIG. 5 is a schematic drawing illustrating an exemplary second reference voltage generator that can be incorporated into the voltage regulation circuits of FIGS. 1 and 2.

FIG. 5 is a schematic diagram illustrating an exemplary second reference voltage generator 120, 220 that can be incorporated into the voltage regulation circuits 100, 200 of FIGS. 1 and 2, respectively. In this second reference voltage generator 120, 220 the variable first reference voltage 131, 231 can be used to control the gate of a pull-down field effect transistor 541 in order to generate the variable second reference voltage 132, 232 at a second output node 121, 221. Specifically, the second reference voltage generator 120, 220 can comprise a pull-down field effect transistor 541 electrically connected in series between a second output node 121, 221 and a diode-connected field effect transistor 542. This pull-down field effect transistor 541 can have a gate that receives the variable first reference voltage 131, 231. When the leakage condition is low and, thus, when the variable first reference voltage 131, 231 is low, the pull-down field effect transistor 541 can be off (i.e., non-conductive) such that a variable second reference voltage 132, 232 generated at the second output node 121, 221 will be high. The diode-connected field effect transistor 542 operates to ensure that the pull-down field effect transistor 541 remains off when the variable first reference voltage 131, 231 is low. Contrarily, when the leakage condition is high and, thus, when the variable first reference voltage 131, 231 is high, the pull-down field effect transistor 541 can be on (i.e., conductive) such that the variable second reference voltage 132, 232 at the second output node 121, 221 is pulled low.

More particularly, as illustrated in FIG. 5, this second reference voltage generator 120, 220 can comprise an intermediate node 520 (also referred to herein as a first intermediate node) electrically connected to the second output node and one or more first field effect transistor 501-503 electrically connected in series between the power supply 190, 290 and the intermediate node 520. The first field effect transistors 501-503 can each have the first type conductivity. For example, the first field effect transistors 501-503 can have P-type conductivity (i.e., they can be PFETs). Each of the first field effect transistors 501-503 can comprise a first gate, a first source and a first drain. In each first field effect transistor 501-503, the first gate can be electrically connected to the first output node 111, 211 such that the first field effect transistors 501-503 are all controlled by the variable first reference voltage 131, 231. Alternatively, in each of the first field effect transistors 501-503 the first gate can be electrically connected to ground 191, 291.

The second reference voltage generator 120, 220 can further comprise one or more second field effect transistors 511-515 electrically connected in series between ground 191, 291 and the intermediate node 520. The second field effect transistors 511-515 can have a second type conductivity different from the first type conductivity. For example, the second field effect transistors can each have an N-type conductivity (i.e., they can be N-type field effect transistors (NFETs)). The second field effect transistors 511-515 can each comprise a second gate, a second source and a second drain. In each second field effect transistor 511-515, the second drain can be electrically connected to the second gate such that each second field effect transistor 511-515 is diode-connected.

The second reference voltage generator 120, 220 can further comprise one or more third field effect transistors 531-532 electrically connected in series between the power supply 190, 290 and the second output node 121, 222. The third field effect transistors 531-532 can each have the first type conductivity. For example, the third field effect transistors 531-532 can each have a P-type conductivity (i.e., they can be PFETs). The third field effect transistors 531-532 can each comprise a third gate, a third source and a third drain. In each third field effect transistor 531-532, the third gate can be electrically connected to the second output node 121, 221 such that the third field effect transistors 531-532 are controlled by the variable second reference voltage 132, 232 at the second output node 121, 221 (see detailed discussion below).

Finally, the second reference voltage generator 120, 220 can further comprise a plurality of fourth field effect transistors 541-542 electrically connected in series between ground 191, 291 and the second output node 121, 221. The fourth field effect transistors 541-542 can each have the second type conductivity. For example, the fourth field effect transistors 541-542 can each have N-type conductivity (i.e., they can be NFETs). The fourth field effect transistors 541-542 can each comprise a fourth gate, a fourth source and a fourth drain. Specifically, a fourth field effect transistor 541, referred to above as the pull-down field effect transistor, can have its fourth drain directly connected to the second output node 121, 221 and its fourth gate electrically connected to the first output node 111, 211 such that it is controlled by the variable first reference voltage 131, 231. Furthermore, at least one additional fourth field effect transistor 542, referred to above as the diode-connected field effect transistor, can have its fourth drain electrically connected to its fourth gate such that this additional fourth field effect transistor 542 is diode-connected.

The goal of this second reference voltage generator 120, 220, as shown in FIG. 5, is to have the variable second reference voltage 132, 232 at the second output node 121, 221 be at or near the supply voltage 190, 290 (i.e., to be very high) when the leakage condition is low and to have it be pulled down, particularly, by the fourth field effect transistor 541 as the leakage condition increases so that it is relatively low when the leakage condition is high.

To accomplish this, in operation, the intermediate voltage 521 at the intermediate node 520 must be high when the leakage condition is low. The PFETs 501-503 will be turned on when the variable first reference voltage 131, 231 is low (i.e., at a low leakage condition) or, alternatively, will be turned on continuously when the gates of those PFETs 501-503 are electrically connected to ground. Current flow through the PFETs 501-503 results in a strong current being supplied to the intermediate node 520, allowing the intermediate voltage 521 to be high. When the PFETs 501-503 are controlled by the variable first reference voltage, they will be stronger (i.e., allow more current to flow through to the intermediate node 520) when the variable first reference voltage 131, 231 is low as compared to when the variable first reference voltage 131, 231 is high. Since there are five diode-connected NFETs 511-515 connected in series between the intermediate node 520 and ground, the intermediate voltage 521 at the intermediate node 520 will be approximately equal to the sum of the threshold voltages of each of the diode connected NFETs 511-515 regardless of the leakage condition. However, because the threshold voltages will be higher when the leakage condition is low and lower when the leakage condition is high, the intermediate voltage 521 on the intermediate node 520 will similarly be higher when the leakage condition is low and lower when the leakage condition is high.

Furthermore, as mentioned above, the gate of the NFET 541 is electrically connected to the first output node 111, 211 such that it is controlled by the variable first reference voltage 131, 231. Since the variable first reference voltage 131, 231 is low when the leakage condition is low, this NFET 541 will remain off such that the variable second reference voltage 132, 232 is not pulled down at the second output node 121, 221 when the leakage condition is low. Since the variable first reference voltage 131, 231 is high when the leakage condition is high, this NFET 541 will turn on such that the variable second reference voltage 132, 232 is pulled down at the second output node 121, 221 when the leakage condition is high.

It should be noted that the diode-connected NFET 542 can be included in the second reference voltage generator 120, 220 to ensure that the NFET 541 turns off when the leakage condition is low. Specifically, since turning off the NFET 541 requires that the gate voltage of the NFET 541 minus the source voltage of the NFET 541 to be less than the threshold voltage of the NFET 541 and since even when the leakage condition is low the variable first reference voltage 131, 231 may be high relative to ground to prevent such a state, a diode-connected NFET 542 can be incorporated to raise the source voltage of the NFET 541 as necessary to allow for turn off when the leakage condition is low.

It should further be noted that the PFETs 531-532 provide a fail safe mechanism for the second reference voltage generator 120, 220 to ensure that the variable second reference voltage 132, 232 at the second output node 121, 221 does not drop below some predetermined voltage amount. Specifically, once the second output node 121, 221 drops below some predetermined voltage amount the PFETs 531-532 will turn on pulling up the voltage on the second output node 121, 220 back toward the supply voltage 190, 290.

Thus, in such a second reference voltage generator 120, 220, at the low leakage condition, the high threshold voltages due to low leakage conditions in the NFETs 511-515 keep the intermediate voltage 521 on the intermediate node 520 high and the low variable first reference voltage 131, 231 and the NFET 542 keeps the NFET 541 turned off so that the variable second reference voltage 132, 232 at the second output node 121, 221 remains high. Contrarily, at the high leakage condition, the lower threshold voltages due to the higher leakage conditions in the NFETs 511-515 reduce the intermediate voltage 521 on the intermediate node 520 and the high variable first reference voltage 131, 231 turns on the NFET 541 to pull the variable second reference voltage 132, 232 down at the second output node 121, 221.

Figure 6A:
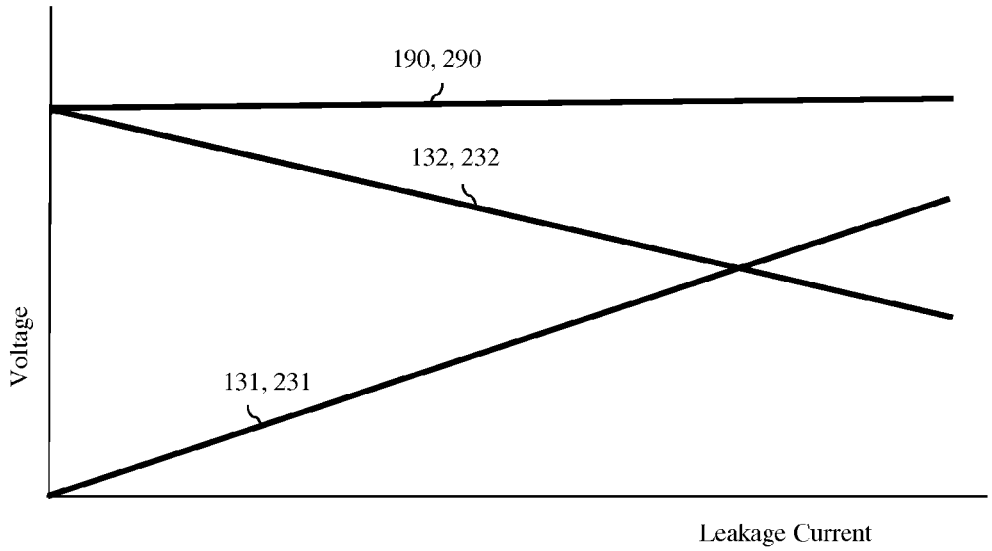
FIG. 6A is a graph illustrating an exemplary variable second reference voltage that can be generated by the second reference voltage generator of FIG. 5.

FIG. 6A is a graph illustrating an exemplary variable second reference voltage 132, 232 generated by the second reference voltage generator 120, 220 based on a given supply voltage as compared to the exemplary variable first reference voltage 131, 231 discussed above and illustrated in FIG. 4A. Specifically, FIG. 6A illustrates that, contrary to the variable first reference voltage 131, 231, the variable second reference voltage 132, 232 is relatively high and, particularly at or near the supply voltage 190, 290 when the leakage condition is low and decreases as the leakage condition increases such that it is relatively low when the leakage condition is high.

Figure 6B:
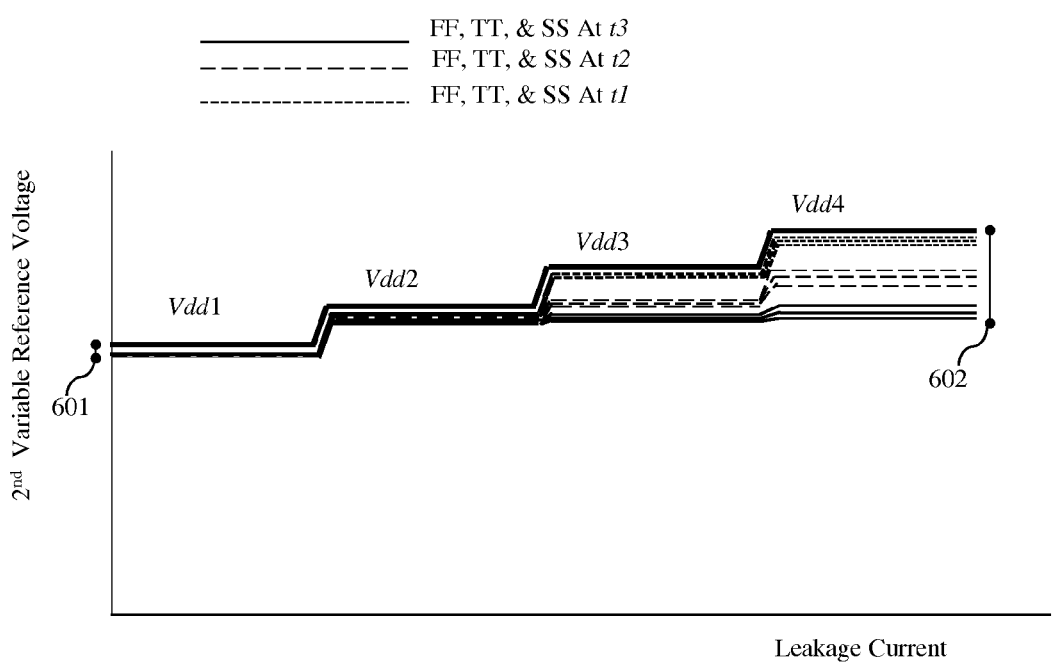
FIG. 6B is a graph illustrating differences in variable second reference voltages generated at different supply voltages Vdd1-Vdd4.

As mentioned above, optionally, the voltage regulation circuit 100, 200 can comprise a variable power supply (not shown) that can generate a supply voltage 190, 290 that is selectively variable between at least a low supply voltage and a high supply voltage that is greater than the low supply voltage. FIG. 6B is a graph illustrating the variable second reference voltage 132, 232 that can be generated by the second reference voltage generator 120, 220 at different supply voltages Vdd1-Vdd4 (e.g., if a supply voltage generator which supplies the supply voltage allows for the generation of multiple different supply voltages). In this graph, as in the graph of FIG. 4B, each line represents one of three different exemplary operating temperatures t1-t3, where t1 is less than t2, and t2 is less than t3, and one of three different process corners (e.g., fast-fast (FF), typical typical (TT) and slow-slow (SS)). As illustrated, the variations in the variable second reference voltage 132, 232 at the different leakage conditions are limited until the supply voltage 190, 290 is relatively high. That is, for example, when the supply voltage 190, 290 is selectively variable between at least a low supply voltage Vdd1 and a high supply voltage Vdd4 that is greater than the low supply voltage Vdd1, the variable second reference voltage 132, 232 will vary as a function of the leakage condition by a first voltage difference 601 between high and low leakage conditions when the voltage regulation circuit 100, 200 operates at the low supply voltage and by a second voltage difference 602 that is greater than the first voltage difference when the voltage regulation circuit 100, 200 operates at the high supply voltage Vdd4.

It should be noted that, for purposes of illustration, the second reference voltage generator 120, 220 is shown in FIG. 5 as having four first field effect transistors 501-504, five second field effect transistors 511-515, two third field effect transistors 531-532 and one additional fourth field effect transistors 542. However, it should be understood that FIG. 5 is not intended to be limiting and that, alternatively, the second reference voltage generator 120, 220 can comprise any number of one or more first field effect transistors, second field effect transistors, third field effect transistors and additional fourth field effect transistors. Those skilled in the art will recognize that the number and sizes of these field effect transistors can be pre-selected to achieve the desired variable second reference voltage swing between high and low leakage conditions at the second output node 121, 221.

Another exemplary second reference voltage generator 120, 220 that can be incorporated in the voltage regulation circuits 100, 200 can have a configuration similar to that shown in FIG. 5, except that any of the diode-connected field effect transistor(s) 511-515 and 542 can be replaced by simple diodes. Those skilled in the art will recognize that the number and sizes of the diodes can be pre-selected to achieve the desired variable second reference voltage swing between high and low leakage conditions at the second output node 121, 221.

The voltage regulation circuits 100, 200 can each further comprise voltage line(s) $195_{1-n}$, $295_{1-n}$, which are electrically connected to and power one or more additional device(s) $101_{1-n}$, $201_{1-n}$ that are components of an integrated circuit device (e.g., memory cells $101_{1-n}$, $201_{1-n}$, or, more particularly, banks of memory cells, such as SRAM cells or DRAM cells, in a memory device, such as an SRAM device or DRAM device). The voltage regulation circuits 100, 200 can also each further comprise pre-charge device(s) $103_{1-n}$, $203_{1-n}$ and power gate device(s) $102_{1-n}$, $202_{1-n}$ electrically connected to corresponding voltage line(s) $195_{1-n}$, $295_{1-n}$ for regulating the actual voltage $196_{1-n}$, $296_{1-n}$ on the voltage line(s) $195_{1-n}$, $295_{1-n}$.

Specifically, each pre-charge device $103_{1-n}$, $203_{1-n}$ can be electrically connected to a corresponding voltage line $195_{1-n}$, $295_{1-n}$ and can selectively enable and disable pre-charging of that corresponding voltage line $195_{1-n}$, $295_{1-n}$ to the supply voltage 190, 290 in response to a digital pre-charge command signal 133, 233. That is, the pre-charge device $103_{1-n}$, $203_{1-n}$ can receive a digital pre-charge command signal 133, 233. Depending upon its logic value, this digital pre-charge command signal 133, 233 can cause the pre-charge device $103_{1-n}$, $203_{1-n}$ to turn on and pull the voltage line $195_{1-n}$, $295_{1-n}$ toward the supply voltage 190, 290 (i.e., to pre-charge the voltage line $195_{1-n}$, $295_{1-n}$) or to turn off.

Following pre-charging of the voltage line $195_{1-n}$, $295_{1-n}$ and when the pre-charge device $103_{1-n}$, $203_{1-n}$ is turned off, the additional device(s) $101_{1-n}$, $201_{1-n}$ may, due to leakage current, pull the voltage line $195_{1-n}$, $295_{1-n}$ away from the supply voltage 190, 290 and the power gate device $102_{1-n}$, $202_{1-n}$ can limit the voltage changes on the voltage line due to such leakage current and can do so differently under different leakage conditions. Specifically, each power gate device $102_{1-n}$, $202_{1-n}$ can be electrically connected to a corresponding voltage line $195_{1-n}$, $295_{1-n}$ and can receive and, particularly, can be controlled by the variable second reference voltage 132, 232 such that, when the actual voltage $196_{1-n}$, $296_{1-n}$ on the voltage line $195_{1-n}$, $295_{1-n}$ is less than the difference between the variable second reference voltage 132, 232 and the threshold voltage of the power gate device $102_{1-n}$, $202_{1-n}$ the power gate device $102_{1-n}$, $202_{1-n}$, will turn on, thereby preventing further voltage changes (i.e., limiting the voltage changes on the voltage line $195_{1-n}$, $295_{1-n}$ due to leakage current in the additional device(s) $101_{1-n}$, $201_{1-n}$). Since the variable second reference voltage 132, 232 is relatively high when the leakage condition is low and relatively low when the leakage condition is high, the power gate device $102_{1-n}$, $202_{1-n}$ will turn on after a smaller amount of voltage change on the voltage line $195_{1-n}$, $202_{1-n}$ when the leakage condition is low as compared to when the leakage condition is high.

More specifically, as illustrated in FIGS. 1 and 2, each pre-charge device $103_{1-n}$, $203_{1-n}$ can comprise a pre-charge field effect transistor with the first type conductivity. For example, each pre-charge device $103_{1-n}$, $203_{1-n}$ can have a P-type conductivity (i.e., can be a PFET). The pre-charge device $103_{1-n}$, $203_{1-n}$ can be electrically connected in series between the power supply 190, 290 and a corresponding voltage line $195_{1-n}$, $295_{1-n}$. The gate of the pre-charge device $103_{1-n}$, $203_{1-n}$ can be controlled by the digital pre-charge command signal 133, 233 (see detailed discussion below regarding the differences between the digital pre-charge command signal in voltage regulation circuit 100 of FIG. 1 and the voltage regulation circuit 200 of FIG. 2). In any case, when the digital pre-charge command signal 133, 233 is low, the pre-charge device $103_{1-n}$, $203_{1-n}$ will be turned on, thereby pulling the voltage line $195_{1-n}$, $295_{1-n}$ up toward the supply voltage 190, 290 (i.e., pre-charging the voltage line $195_{1-n}$, $295_{1-n}$), whereas when the digital pre-charge command signal 133, 233 is high, the pre-charge device $103_{1-n}$, $203_{1-n}$ will be turned off, thereby stopping any pre-charging of the voltage line $195_{1-n}$, $295_{1-n}$.

Each power gate device $102_{1-n}$, $202_{1-n}$ can comprise a power gate field effect transistor having the second conductivity type. For example, each power gate device $102_{1-n}$, $202_{1-n}$ can have an N-type conductivity (i.e., can be an NFET). The power gate device $102_{1-n}$, $202_{1-n}$ can be electrically connected in series between the power supply 190, 290 and a corresponding voltage line $195_{1-n}$, $295_{1-n}$. The gate of the power gate device $102_{1-n}$, $202_{1-n}$ can be electrically connected to the second output node 121, 221 of the second reference voltage generator 120, 220 such that the power gate device $102_{1-n}$, $202_{1-n}$ is controlled by the variable second reference voltage 132, 232. Thus, the actual voltage $196_{1-n}$, $296_{1-n}$ on the voltage line $195_{1-n}$, $295_{1-n}$ will be the source voltage for the NFET $102_{1-n}$, $202_{1-n}$ and the variable second reference voltage 132, 232 is the gate voltage. Configured in this manner, when the source voltage (i.e., the actual voltage $196_{1-n}$, $296_{1-n}$ on the voltage line $195_{1-n}$, $295_{1-n}$) drops due to leakage current in the additional device(s) $101_{1-n}$, $201_{1-n}$, the power gate device $102_{1-n}$, $202_{1-n}$ can turn on, preventing any further voltage drop on the voltage line $195_{1-n}$, $295_{1-n}$ and, particularly, will do so when the actual voltage $196_{1-n}$, $296_{1-n}$ on the voltage line $195_{1-n}$, $295_{1-n}$ drops such that the difference between the gate voltage (i.e., the variable second reference voltage 132, 232) and the voltage $196_{1-n}$, $296_{1-n}$ on the voltage line $195_{1-n}$, $295_{1-n}$ is greater than the threshold voltage of the power gate device $102_{1-n}$, $202_{1-n}$. When the leakage condition is low, the NFET $102_{1-n}$, $202_{1-n}$ will turn on after only a minimal amount of voltage change on the voltage line $195_{1-n}$, $295_{1-n}$ because the variable second reference voltage 132, 232 will be relatively high. However, when the leakage condition is high, the NFET $102_{1-n}$, $202_{1-n}$ will require a significantly larger voltage change to turn on because the variable second reference voltage 132, 232 will be relatively low. It should be understood that, although a lesser amount of voltage change is required for the NFET $102_{1-n}$, $202_{1-n}$ to turn on when the leakage condition is low as compared to when the leakage condition is high, the amount of time that passes before the NFET $102_{1-n}$, $202_{1-n}$ turns on after pre-charging may be greater when the leakage condition is low as compared to when the leakage condition is high because when the leakage condition is high the voltage change will occur more quickly.

As mentioned above, the gate of the pre-charge device $103_{1-n}$, $203_{1-n}$ can be controlled by a digital pre-charge command signal 133, 233. In the case of a memory device, this digital pre-charge command signal can simply comprise, for example, an inverted bit-decode signal, which will have a logic "0" value whenever pre-charging is required for read and write operations and which will have a logic "1" value whenever pre-charging is completed so as to allow for subsequent voltage regulation.

However, alternatively, this digital pre-charge command signal can be a leakage-aware digital control signal, as shown in the voltage regulation circuit 200 of FIG. 2, such that the actual voltage $296_{1-n}$ on the voltage line $295_{1-n}$ is only allowed to fluctuate when the leakage condition is high. More particularly, the voltage regulation circuit 200 of FIG. 2 can further comprise logic gate(s) $250_{1-n}$ electrically connected to the pre-charge device(s) $203_{1-n}$ and a digital signal generator 240 electrically connected to the logic gate(s) $250_{1-n}$.

The digital signal generator 240 can further be electrically connected to the first output node 211 of the first reference voltage generator 210 and can generate a digital first pre-charge command signal 236 at a third output node 242 using the supply voltage 290 and the variable first reference voltage 231. This digital first pre-charge command signal 236 can be leakage-dependent such that it indicates a leakage current amount relative to a predetermined threshold leakage current. Specifically, when the leakage current amount is low (i.e., below a predetermine threshold leakage current amount), the digital pre-charge command signal 236 can have a logic "1" value; whereas, when the leakage current amount is high (i.e., above a predetermined threshold leakage current amount), the digital first pre-charge command signal 236 can have a logic "0" value.

A logic gate $250_{1-n}$ and, particularly, a NOR logic gate can gate the digital first pre-charge command signal 236 to the pre-charge device $203_{1-n}$. Specifically, the NOR logic gate $250_{1-n}$ can receive both the digital first pre-charge command signal 236 from the digital signal generator 240 and a bit-decode signal 234 (i.e., a digital signal, which will have a logic "1" value whenever pre-charging is required for read and write operations and which will have a logic "0" value whenever pre-charging is completed), as inputs, and will output a digital second pre-charge command signal 233. Those skilled in the art will recognize that a NOR logic gate $250_{1-n}$ will output a logic "0" value when any of its inputs have a logic "1" value. Thus, when the digital first pre-charge command signal 236 has a logic "1" value because the leakage condition is low and/or the bit-decode signal 234 has a logic "1" value because pre-charge is required for a read or write operation, then the digital second pre-charge command signal 233 will have a logic "0" value, thereby turning on the pre-charge device $203_{1-n}$ and enabling pre-charging of the voltage line $295_{1-n}$. As a result, the additional device(s) $201_{1-n}$ will only be able to pull down the voltage line $295_{1-n}$ away from the supply voltage 290 when the leakage condition is high and, thus, the power gate device $202_{1-n}$ will only be able to turn on and limit any voltage changes on the voltage line when the leakage condition is high.

Figure 7:
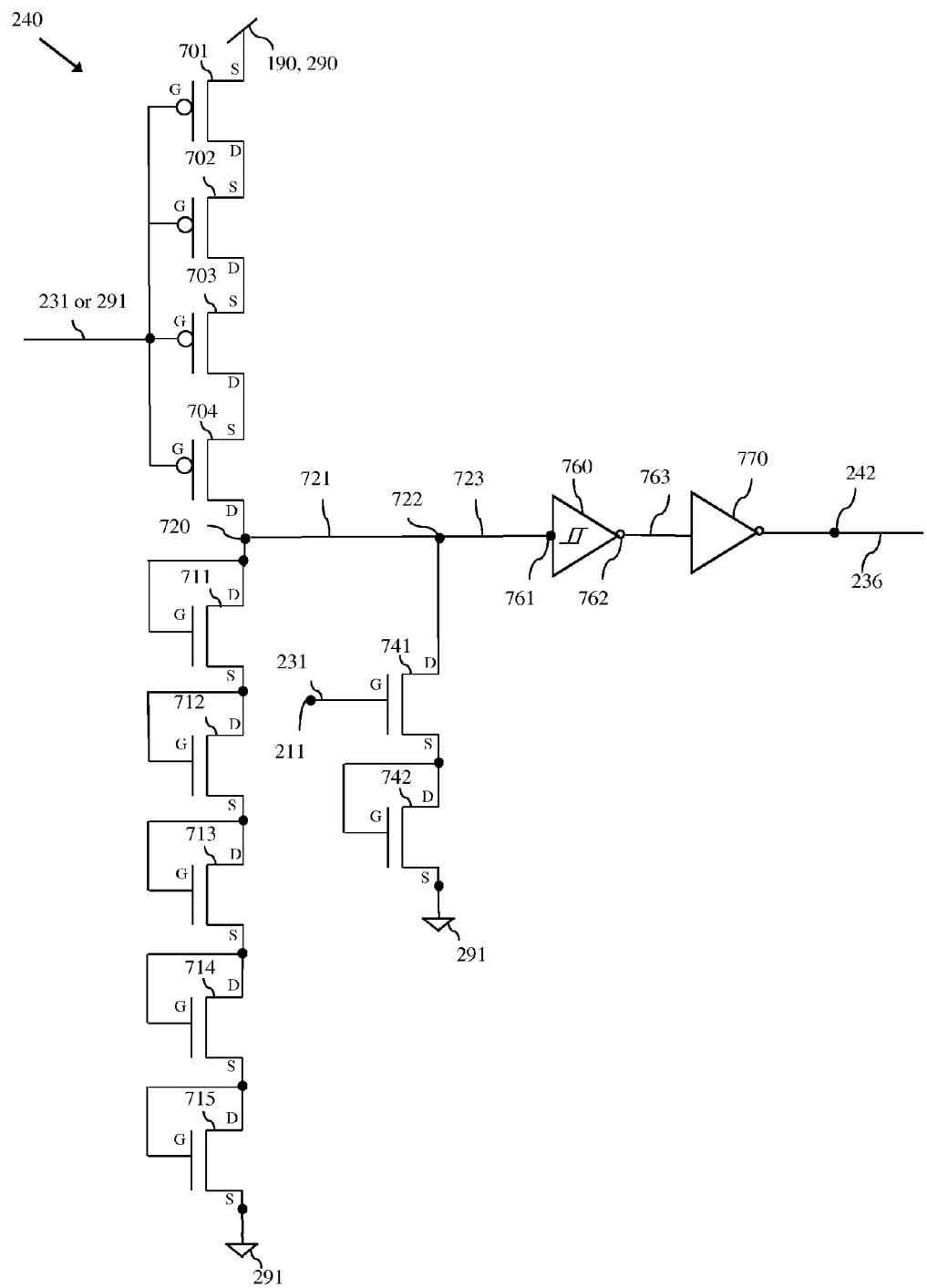
FIG. 7 is a schematic drawing illustrating an exemplary digital signal generator that can be incorporated into the voltage regulation circuit of FIG. 2.

FIG. 7 is a schematic diagram illustrating an exemplary digital signal generator 240 that can be incorporated into the voltage regulation circuit 200 of FIG. 2. In this digital signal generator 240, as in the variable second reference voltage generator 220, the variable first reference voltage 231 can be used to control the gate of a pull-down field effect transistor. Specifically, in this case, the digital signal generator 240 can comprise a pull-down field effect transistor 741 electrically connected in series between an intermediate node 722 and a diode-connected field effect transistor 742. This pull-down field effect transistor 741 can have a gate that receives the variable first reference voltage 231. When the leakage condition is low and, thus, when the variable first reference voltage 231 is low, the pull-down field effect transistor 741 can be off (i.e., non-conductive) such that an intermediate voltage 723 generated at the intermediate node will be high. The diode-connected field effect transistor 742 operates to ensure that the pull-down field effect transistor 741 remains off when the variable first reference voltage 231 is low. Contrarily, when the leakage condition is high and, thus, when the variable first reference voltage 231 is high, the pull-down field effect transistor 741 can be on (i.e., conductive) such that the intermediate voltage 723 at the intermediate node 722 is pulled low. It should be noted that the pull-down field effect transistor 741 can be relatively strong as compared to, for example, the pull-down field effect transistor 541 such that the voltage swing on the intermediate node 722 is sufficient for use in generating a digital signal at a third output node 242.

More particularly, as illustrated in FIG. 7, this digital signal generator 240 can comprise one or more fifth field effect transistors 701-704 electrically connected in series between the power supply 290 and a second intermediate node 720. The fifth field effect transistors 701-704 can each have the first conductivity type. For example, the fifth field effect transistors 701-704 can each have P-type conductivity (i.e., can each be PFETs) and can comprise a fifth gate, a fifth source and a fifth drain. In each fifth field effect transistor 701-704, the fifth gate can be electrically connected to the first output node 211 such that these fifth field effect transistors 701-704 are controlled by the variable first reference voltage 231. Alternatively, in each of the fifth field effect transistors 701-703 the fifth gate can be electrically connected to ground 291.

The digital signal generator 240 can further comprise one or more sixth field effect transistors 711-715 electrically connected in series between ground 291 and the second intermediate node 720. The sixth field effect transistors 711-715 can each have N-type conductivity (i.e., they can be NFETs) and can each comprise a sixth gate, a sixth source and a sixth drain. In each sixth field effect transistor 711-715, the sixth drain can be electrically connected to the sixth gate such that these sixth field effect transistors are all diode-connected.

The digital signal generator 240 can further comprise a third intermediate node 722 electrically connected to the second intermediate node 720 and a plurality of seventh field effect transistors 741-742 electrically connected in series between ground 791 and the third intermediate node 722. The seventh field effect transistors 741-742 can each have the second type conductivity. For example, the seventh field effect transistors 741-742 can each have N-type conductivity (i.e., they can be NFETs) and can each comprise a seventh gate, a seventh source and a seventh drain. One of the seventh field effect transistors 741, referred to above as the pull-down field effect transistor, can have its seventh drain directly connected to the third intermediate node 722 and its seventh gate electrically connected to the first output node 211 such that it is controlled by the variable first reference voltage 231. At least one additional seventh field effect transistor 742, referred to above as the diode-connected field effect transistor, can be electrically connected in series between the seventh field effect transistor 741 and ground 291. This additional seventh field effect transistor 742 can have its seventh drain electrically connected to its seventh gate such that it is diode-connected.

The digital signal generator 240 can further comprise a Schmitt trigger device 760 and an inverter 770 electrically connected in series between the third intermediate node 722 and the third output node 242.

The goal of this digital signal generator 240, as shown in FIG. 7, is to have the digital first pre-charge command signal 236 to be very low (i.e., at approximately ground 291) when the leakage condition is high and very high (i.e., at approximately the supply voltage 290) when the leakage condition is low.

To accomplish this, in operation, the second intermediate voltage 721 at the second intermediate node 720 must be high when the leakage condition is low. The PFETs 701-704 will be turned on when the variable first reference voltage 231 is low (i.e., at a low leakage condition) or, alternatively, will be turned on continuously when the gates of those PFETs 701-704 are electrically connected to ground 291. Current flow through the PFETs 701-704 results in a strong current being supplied to the second intermediate node 720, allowing the second intermediate voltage 721 to be high. When the PFETs 701-704 are controlled by the variable first reference voltage 231, they will be stronger (i.e., allow more current to flow through to the intermediate node 520) when the variable first reference voltage 231 is low as compared to when the variable first reference voltage 231 is high. Since there are five diode-connected NFETs 711-715 connected in series between the second intermediate node 720 and ground 291, the second intermediate voltage 721 at the second intermediate node 720 will be approximately equal to the sum of the threshold voltages of each of the diode connected NFETs 711-715 regardless of the leakage condition. However, because the threshold voltages will be higher when the leakage condition is low and lower when the leakage condition is high, the second intermediate voltage 721 on the second intermediate node 720 will similarly be higher when the leakage condition is low and lower when the leakage condition is high.

Furthermore, as mentioned above, the gate of the NFET 741 is electrically connected to the first output node 211 such that it is controlled by the variable first reference voltage 231. Since the variable first reference voltage 231 is low when the leakage condition is low, this NFET 741 will remain off such that a third intermediate voltage 723 on the third intermediate node 722 is not pulled down when the leakage condition is low. Since the variable first reference voltage 231 is high when the leakage condition is high, this NFET 741 will turn on such that the third intermediate voltage 723 on the third intermediate node 722 is pulled down when the leakage condition is high.

As with the diode-connected NFET 542, the diode-connected NFET 742 can be included in the digital signal generator 240 to ensure that the NFET 741 turns off when the leakage condition is low. Specifically, since turning off the NFET 741 requires that the gate voltage of the NFET 741 minus the source voltage of the NFET 741 to be less than the threshold voltage of the NFET 741 and since even when the leakage condition is low the variable first reference voltage 231 may be high relative to ground to prevent such a state, a diode-connected NFET 742 can be incorporated to raise the source voltage of the NFET 741 as necessary to allow for turn off when the leakage condition is low.

Thus, in such a digital signal generator 240, at the low leakage condition, the high threshold voltages due to low leakage conditions in the NFETs 711-715 keep the second intermediate voltage 721 on the second intermediate node 720 high and the low variable first reference voltage 231 and the NFET 742 keeps the NFET 741 turned off so that the third intermediate voltage 723 at the third intermediate node 722 remains high (e.g., at or near the supply voltage 290). Contrarily, at the high leakage condition, the lower threshold voltages due to the higher leakage conditions in the NFETs 711-715 reduce the second intermediate voltage 721 on the second intermediate node 720 and the high variable first reference voltage 231 turns on the NFET 741 to pull the third intermediate voltage 723 down (e.g., to one threshold voltage above ground) at the third intermediate node 722.

The Schmitt trigger device 760 can have an input 761 electrically connected to the third intermediate node 722 and an output 762 electrically connected to the inverter 770. This Schmitt trigger device 760 can be used to remove noise and create a clear digital signal. This Schmitt trigger device 760 can have an inverting configuration. That is, if the third intermediate voltage 723 is high at the input 761, the digital signal 763 at the output 762 will be low (i.e., have a logic value of "0") and vice versa. Since this digital signal 763 is further run through the inverter 770, the digital first pre-charge command signal 236 at the third output node 242 will be very low (i.e., have a logic value of "0") when the leakage condition is high and will be very high (i.e., have a logic value of "1") when the leakage condition is low.

It should be noted that, in this digital signal generator 240, the NFET 741 can be relatively large as compared to the NFET 541 in the second reference voltage generator 220 such that, when it is turned on under a high leakage condition, it pulls down the third intermediate voltage 723 on the third intermediate node 722 by a larger amount. Such a large pull down of the third intermediate voltage 723 by the NFET 741 is necessary to achieve a digital first pre-charge command signal 236 with a logic "0" value when the leakage condition is high.

It should be noted that, for purposes of illustration, the digital signal generator 240, is shown in FIG. 7 as having four fifth field effect transistors 701-704, five sixth field effect transistors 711-715, and one additional seventh field effect transistors 742. However, it should be understood that FIG. 7 is not intended to be limiting and that, alternatively, the digital signal generator 240 can comprise any number of one or more fifth field effect transistors, sixth field effect transistors, and additional seventh field effect transistors. Those skilled in the art will recognize that the number and sizes of these field effect transistors can be pre-selected to achieve the desired third intermediate voltage swing between high and low leakage conditions at the third intermediate node 722.

Another exemplary digital signal generator 240 that can be incorporated in the voltage regulation circuit 200 can have a configuration similar to that shown in FIG. 7, except that any of the diode-connected field effect transistor(s) 711-715 and 742 can be replaced by simple diodes. Those skilled in the art will recognize that the number and sizes of the diodes can be pre-selected to achieve the desired voltage swing between high and low leakage conditions at the third intermediate node 722.

Figure 8:
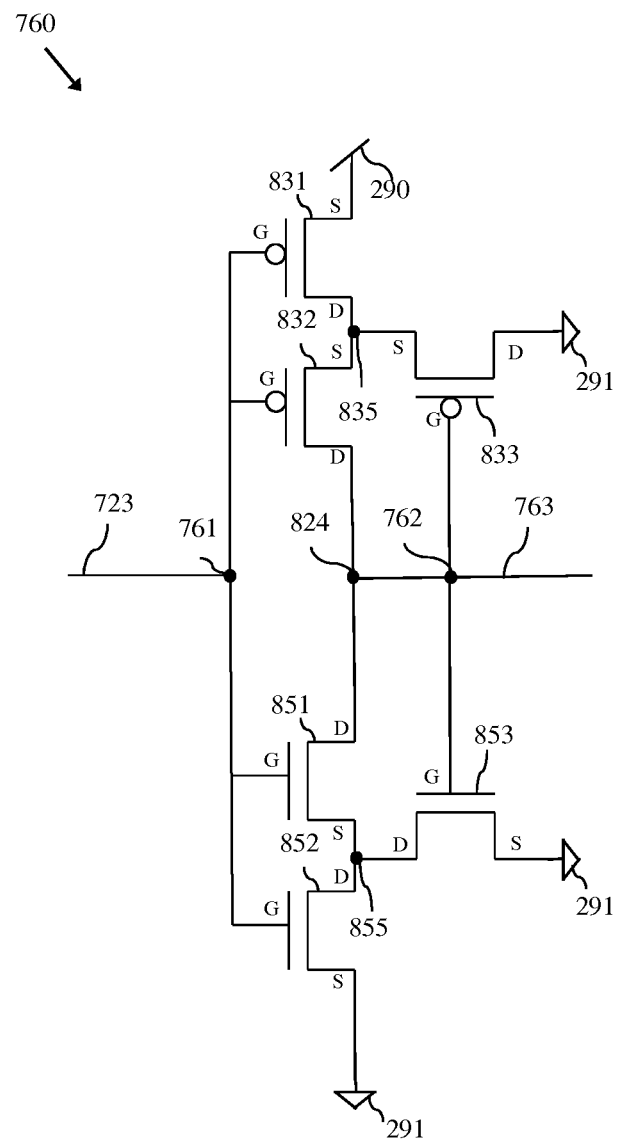
FIG. 8 is a schematic drawing illustrating an exemplary Schmitt trigger device that can be incorporated into the digital signal generator of FIG. 7; and, FIG. 9 is flow diagram illustrating a leakage-aware voltage regulation method.

FIG. 8 is a schematic diagram illustrating an exemplary Schmitt trigger device 760 that can be incorporated into the digital signal generator 240 of FIG. 7. As mentioned above, this Schmitt trigger device 760 can have an input 761 be electrically connected to the third intermediate node 722 such that the Schmitt trigger device 760 is driven by the third intermediate voltage 723 on the third intermediate node 722. Additionally, the Schmitt trigger device 760 can comprise an output 762 electrically connected (e.g., via the inverter 770) to the third output node 242.

This exemplary Schmitt trigger device 760 can further comprise a pair of eighth field effect transistors 831-832 electrically connected in series between the power supply 290 and a fourth intermediate node 824. The eighth field effect transistors can have the first type conductivity. For example, the eighth field effect transistors 831-832 can each have P-type conductivity (i.e., they can be PFETs) and can comprise an eighth gate, an eighth source and an eighth drain. In each of the eighth field effect transistors 831-832, the eighth gate can be electrically connected to the input 761 and, thereby controlled by the third intermediate voltage 723 at the third intermediate node 722. The Schmitt trigger device 760 can further comprise a pair of ninth field effect transistors 851-852 electrically connected in series between ground 291 and the fourth intermediate node 824. The ninth field effect transistors 851-852 can each have the second type conductivity. For example, the ninth field effect transistors 851-852 can have N-type conductivity (i.e., they can be NFETs) and can comprise a ninth gate, a ninth source and a ninth drain. In each ninth field effect transistor 851-852, the ninth gate can be electrically connected to the input 761 and, thereby controlled by the third intermediate voltage 723 at the third intermediate node 722.

This exemplary Schmitt trigger device 760 can further comprise a fifth intermediate node 835 between the pair of eighth field effect transistors 831-832 and a sixth intermediate node 855 between the pair of ninth field effect transistors 851-852. Additionally, a tenth field effect transistor 833 can be electrically connected in series between the fifth intermediate node 835 and ground 291. This tenth field effect transistor 833 can the first type conductivity. For example, the tenth field effect transistors 833 can have P-type conductivity (i.e., can be a PFET) and can comprise a tenth gate, a tenth source and a tenth drain. Similarly, an eleventh field effect transistor 853 can be electrically connected in series between the sixth intermediate node 855 and ground 291. This eleventh field effect transistor 853 can have the second type conductivity. For example, the eleventh field effect transistor 853 can have N-type conductivity (i.e., can be an NFET) and can comprise an eleventh gate, an eleventh source and an eleventh drain. The tenth gate of the tenth field effect transistor 833 and the eleventh gate of the eleventh field effect transistor 853 can both be electrically connected to the output 762.

Figure 9:
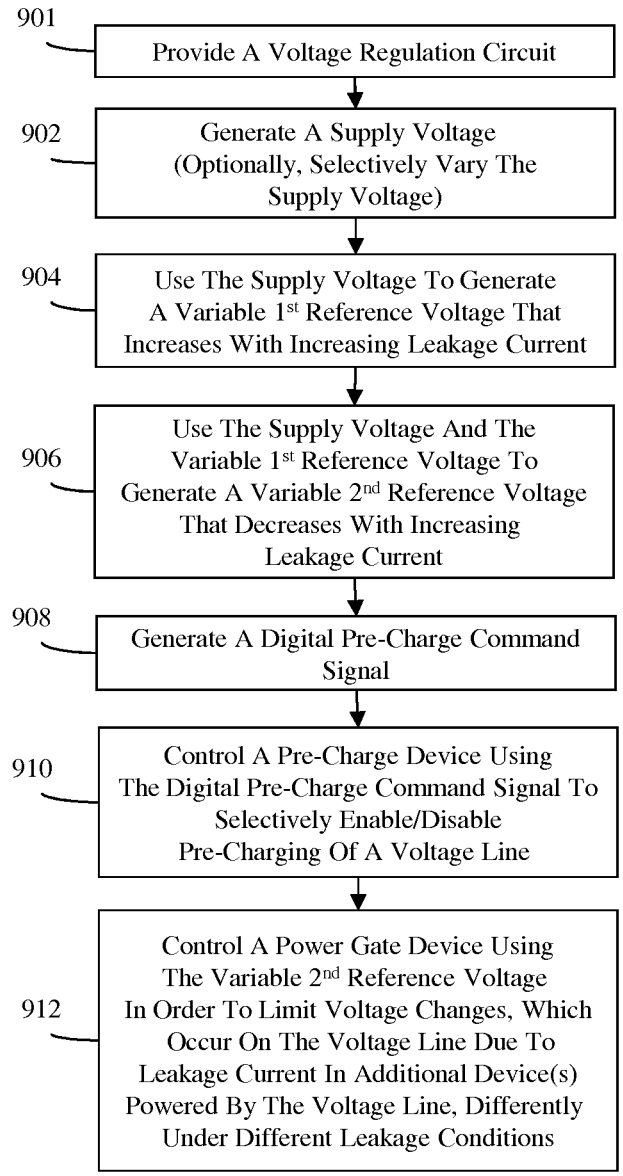

Referring to FIG. 9 in combination with FIGS. 1 and 2, also disclosed herein are voltage regulation methods associated with the above-described voltage regulation circuits 100, 200. Specifically, the voltage regulation methods can comprise providing a voltage regulation circuit, such as one of the circuits 100 or 200 described above and illustrated in FIG. 1 or 2 (901).

The methods can further comprise generating (e.g., by a power supply of the voltage regulation circuit 100, 200) a supply voltage 190, 290 (e.g., a positive supply voltage (Vdd)) (902).

The methods can further comprise using (e.g., by a first reference voltage generator 110, 210 of the voltage regulation circuit 100, 200) the supply voltage 190, 290 to generate a variable first reference voltage 131, 231 (904). This variable first reference voltage 131, 231 can be a leakage-aware variable first reference voltage (i.e., can be dependent upon leakage current) such that, as the leakage current increases, the variable first reference voltage 131, 231 will be pulled toward the supply voltage 190, 290, as shown in FIG. 4A. Specifically, this variable first reference voltage 131, 231 can be generated such that it is closer to the supply voltage 190, 290 when the leakage condition is high as compared to when the leakage condition is low. That is, the variable first reference voltage 131, 231 can be generated such that it is relatively high and, particularly, close to the supply voltage 190, 290 when the leakage condition is high and decreases as the leakage conditions decreases such that it is relatively low when the leakage condition is low. Thus, this variable first reference voltage 131, 231 will be similar to a proportional to absolute temperature (PTAT) voltage reference with the added feature of further taking into account process variations.

The methods can further comprise using (e.g., by a second reference voltage generator 120, 220 of the voltage regulation circuit 100, 200) the supply voltage 190, 290 and the variable first reference voltage 131, 231 to generate a variable second reference voltage 132, 232 (906). This variable second reference voltage 132, 232 can be a leakage-aware variable second reference voltage (i.e., can be dependent upon leakage current) such that, as the leakage current decreases, the variable second reference voltage 132, 232 will be pulled toward the supply voltage 190, 290, as shown in FIG. 6A. Specifically, this variable second reference voltage 132, 232 can be generated such that it is closer to the supply voltage when the leakage condition is low as compared to when the leakage condition is high. That is, contrary to the variable first reference voltage 131, 231, the variable second reference voltage 132, 232 can be generated such that it is relatively high and, particularly, at or near the supply voltage 190, 290 when the leakage condition is low and decreases as the leakage condition increases such that it is relatively low when the leakage condition is high. Thus, this variable second reference voltage 132, 232 will be similar to a complementary to absolute temperature (CTAT) voltage reference with the added feature of further taking into account process variations.

The methods can further comprise generating a digital pre-charge command signal 133, 233 (as discussed in greater detail below) (908).

The methods can further comprise controlling a pre-charge device $103_{1-n}$, $203_{1-n}$ of the voltage regulation circuit 100, 200 using the digital pre-charge command signal 133, 233 (910). Specifically, depending upon its logic value, this digital pre-charge command signal 133, 233 can be applied to turn on or off the pre-charge device $103_{1-n}$, $203_{1-n}$ and, thereby selectively enable or disable pre-charging of a voltage line $195_{1-n}$, $295_{1-n}$ to the supply voltage 190, 290. For example, once generated at process 908, the digital pre-charge command signal 133, 233 can be applied to a pre-charge device $103_{1-n}$, $203_{1-n}$ (e.g., to the gate of a pre-charge PFET). Depending upon its logic value, this digital pre-charge command signal 133, 233 can cause the pre-charge device $103_{1-n}$, $203_{1-}$ to turn on (e.g., if it has a logic "0" value) to pull the voltage line $195_{1-n}$, $295_{1-n}$ toward the supply voltage 190, 290 (i.e., to pre-charge the voltage line) or to turn off (e.g., if it has a logic "1" value).

The voltage line $195_{1-n}$, $295_{1-n}$ can be electrically connected to and can power one or more additional devices $101_{1-n}$, $201_{1-n}$ (e.g., memory cells or, more particularly, banks of memory cells, such as SRAM cells or DRAM cells, in a memory device, such as an SRAM device or DRAM device). Following pre-charging of the voltage line $195_{1-n}$, $295_{1-n}$ at process 910 and when the pre-charge device $103_{1-n}$, $203_{1-}$ is turned off, the voltage line $195_{1-n}$, $295_{1-n}$ may be pulled away from the supply voltage 190, 290 due to leakage current in the additional device(s) $101_{1-n}$, $201_{1-n}$.

The methods can further comprise controlling a power gate device $102_{1-n}$, $202_{1-n}$ of the voltage regulation circuit 100, 200 using the variable second reference voltage 132, 232 (912). This variable second reference voltage 132, 232 can control the power gate device $102_{1-n}$, $202_{1-n}$ and, particularly, can cause the power gate device $102_{1-n}$, $202_{1-n}$ to turn on when the actual voltage $196_{1-n}$, $296_{1-n}$ on the voltage line $195_{1-n}$, $295_{1-n}$ is less than the difference between the variable second reference voltage 132, 232 and the threshold voltage of the power gate device $102_{1-n}$, $202_{1-n}$ thereby limiting voltage changes on the voltage line $195_{1-n}$, $295_{1-n}$ due to leakage current in the additional device(s) $101_{1-n}$, $201_{1-n}$ and doing so differently under different leakage conditions. Since the variable second reference voltage 132, 232 is relatively high when the leakage condition is low and relatively low when the leakage condition is high, the power gate device $102_{1-n}$, $202_{1-n}$ will turn on after a smaller amount of voltage change on the voltage line $195_{1-n}$, $295_{1-n}$ when the leakage condition is low as compared to when the leakage condition is high.

It should be noted that, optionally, the method can further comprise generating the pre-charge command signal at process 908 such that it is leakage-aware and, particularly, such that the pre-charge device $103_{1-n}$, $203_{1-n}$ will turn on to pull the voltage line $195_{1-n}$, $295_{1-n}$ toward the supply voltage 190, 290 whenever a pre-charging process is required for operation of the additional device(s) $101_{1-n}$, $201_{1-n}$ and/or whenever the leakage condition is low. In this case, the actual voltage $196_{1-n}$, $296_{1-n}$ on the voltage line $195_{1-n}$, $295_{1-n}$ will only be pulled away from the supply voltage 190, 290 by the additional device(s) $101_{1-n}$, $201_{1-n}$ when the leakage condition is high and a pre-charging process is not required for operation of the additional device(s) $101_{1-n}$, $201_{1-n}$ and, thus, the power gate device $102_{1-n}$, $202_{1-n}$ can only turn on when the leakage condition is high.

It should be noted that, also optionally, the method can further comprise selectively varying the supply voltage at process 902 between at least a low supply voltage Vdd1 and a high supply voltage Vdd4 that is greater than the low supply voltage Vdd1. In this case, the variable second reference voltage 132, 232 will vary, as illustrated in the graph of FIG. 6B discussed in detail above, as a function of the leakage condition by a first voltage difference 601 between high and low leakage conditions when the voltage regulation circuit 100, 200 operates at the low supply voltage Vdd1 and by a second voltage difference 602 that is greater than the first voltage difference 601 when the voltage regulation circuit 100, 200 operates at the high supply voltage Vdd4.

It should be noted that the terminology used herein is for the purpose of describing the disclosed methods and structures and is not intended to be limiting. For example, as used herein, the singular forms "a", "an" and "the" are intended to include the plural forms as well, unless the context clearly indicates otherwise. As used herein, the terms "comprises" "comprising", "includes" and/or "including", specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are leakage-aware voltage regulation circuits and methods for integrated circuit devices and, particularly, for memory devices. In the circuits and methods, a pre-charge device and a power gate device can be electrically connected to a voltage line that supplies power to at least one additional device (e.g., one or more memory cells in a memory device). The pre-charge device can pre-charge the voltage line toward a supply voltage. After pre-charging, the power gate device can limit any voltage changes on the voltage line due to leakage current in the additional device(s) and can do so differently under different leakage conditions. Specifically, a leakage-aware variable first reference voltage (Vref1) can be generated such that it is closer to the supply voltage (i.e., relatively high) when a leakage condition is high as compared to when the leakage condition is low. Then, using Vref1 and the supply voltage, a leakage-aware variable second reference voltage (Vref2) can be generated such that it is closer to the supply voltage (i.e., relatively high) when the leakage condition is low as compared to when the leakage condition is high. The power gate device can be controlled by Vref2 so that it turns on when the actual voltage is less than the difference between Vref2 and the threshold voltage of the power gate device so as to limit voltage changes on the voltage line due to leakage current in the additional device(s). Since Vref2 is relatively high when the leakage condition is low and relatively low when the leakage condition is high, the power gate device will turn on after a smaller amount of voltage change on the voltage line when the leakage condition is low as compared to when the leakage condition is high. Optionally, the pre-charge device can be controlled by a leakage-aware pre-charge command signal to ensure that fluctuation of the voltage on the voltage line away from the supply voltage does not occur when the leakage condition is low and is only permitted when the leakage condition is high.

What is claimed is:

1. A voltage regulation circuit comprising:
a first reference voltage generator generating a variable first reference voltage, said variable first reference voltage being closer to a supply voltage when a leakage condition is high as compared to when said leakage condition is low;
a second reference voltage generator generating a variable second reference voltage using said variable first reference voltage and said supply voltage, said variable second reference voltage being closer to said supply voltage when said leakage condition is low as compared to when said leakage condition is high;
a power gate device;
a pre-charge device; and,
a voltage line electrically connected to said power gate device and said pre-charge device, said voltage line supplying power to at least one additional device,
said pre-charge device turning on and pulling said voltage line toward said supply voltage in response to a pre-charge command signal, and
said power gate device being controlled by said variable second reference voltage and turning on when an actual voltage on said voltage line is less than a difference between said variable second reference voltage and a threshold voltage of said power gate device so as to limit voltage changes on said voltage line due to leakage current in said at least one additional device.

2. The voltage regulation circuit of claim 1,
said second reference voltage generator comprising a pull-down field effect transistor electrically connected in series between an output node and a diode-connected field effect transistor,
said pull-down field effect transistor having a gate that receives said variable first reference voltage,
said pull-down field effect transistor being off when said variable first reference voltage is low such that said variable second reference voltage at said output node is high, and
said pull-down field effect transistor being on when said variable first reference voltage is high such that said variable second reference voltage at said output node is pulled low.

3. The voltage regulation circuit of claim 1, said leakage condition being a function of operating temperature and process variations.

4. The voltage regulation circuit of claim 1, said at least one memory cell comprising one of a static random access memory (SRAM) cell and a dynamic random access memory (DRAM) cell.

5. The voltage regulation circuit of claim 1,
said supply voltage being selectively variable between at least a low supply voltage and a high supply voltage that is greater than said low supply voltage, and
said variable second reference voltage varying as a function of said leakage condition by a first voltage difference between high and low leakage conditions when said voltage regulation circuit operates at said low supply voltage and by a second voltage difference that is greater than said first voltage difference when said voltage regulation circuit operates at said high supply voltage.

6. The voltage regulation circuit of claim 1,
said pre-charge device comprising a pre-charge field effect transistor electrically connected in series between said supply voltage and said voltage line,
said power gate device comprising a power gate field effect transistor having a different type conductivity than said pre-charge field effect transistor and being electrically in series between said supply voltage and said voltage line, and
said variable second reference voltage being applied to a gate of said power gate field effect transistor.

7. The voltage regulation circuit of claim 1, said supply voltage comprising a positive supply voltage and said first reference voltage generator comprising:
- a first output node;
- at least one field effect transistor electrically connected in series between said positive supply voltage and said first output node, each field effect transistor having a P-type conductivity and being diode-connected; and,
- a resistor electrically connected in series between said first output node and ground, said variable first reference voltage being generated at said first output node.

8. The voltage regulation circuit of claim 7, said second reference voltage generator comprising:
- an intermediate node and a second output node electrically connected to said intermediate node, said variable second reference voltage being generated at said second output node;
- at least one first field effect transistor electrically connected in series between said positive supply voltage and said intermediate node, each first field effect transistor having a P-type conductivity and comprising a first gate, a first source and a first drain, said first gate being electrically connected to any one of said first output node and ground;
- at least one second field effect transistor electrically connected in series between said ground and said intermediate node, each second field effect transistor having an N-type conductivity and comprising a second gate, a second source and a second drain, said second drain being electrically connected to said second gate such that said second field effect transistor is diode-connected;
- at least one third field effect transistor electrically connected in series between said positive supply voltage and said second output node, each third field effect transistor having said P-type conductivity and comprising a third gate, a third source and a third drain, said third gate being electrically connected to said second output node; and,
- a plurality of fourth field effect transistors electrically connected in series between ground and said second output node, said fourth field effect transistors each having said N-type conductivity and each comprising a fourth gate, a fourth source and a fourth drain, said plurality of fourth field effect transistors comprising: one fourth field effect transistor having said fourth drain directly connected to said second output node and said fourth gate electrically connected to said first output node; and at least one additional fourth field effect transistor having said fourth drain electrically connected to said fourth gate such that said at least one additional fourth field effect transistor is diode-connected.

9. A voltage regulation circuit comprising:
- a first reference voltage generator generating a variable first reference voltage, said variable first reference voltage being closer to a supply voltage when a leakage condition is high as compared to when said leakage condition is low;
- a second reference voltage generator generating a variable second reference voltage using said variable first reference voltage and said supply voltage, said variable second reference voltage being closer to said supply voltage when said leakage condition is low as compared to when said leakage condition is high;
- a digital signal generator using said variable first reference voltage to generate a leakage condition indicator signal;
- a logic gate receiving, as inputs, said leakage condition indicator signal and a first pre-charge command signal and outputting a second pre-charge command signal;
- a power gate field effect transistor;
- a pre-charge field effect transistor having a different type conductivity than said power gate field effect transistor; and,
- a voltage line electrically connected to said power gate field effect transistor and said pre-charge field effect transistor, said voltage line supplying power to at least one additional device;
- said pre-charge field effect transistor turning on and pulling said voltage line toward said supply voltage when said first pre-charge command signal commands pre-charging of said voltage line during any leakage condition and also when said leakage condition indicator signal indicates that said leakage condition is low, and
- said power gate field effect transistor being controlled by said variable second reference voltage and turning on when an actual voltage on said voltage line is less than a difference between said variable second reference voltage and a threshold voltage of said power gate field effect transistor so as to limit voltage changes on said voltage line due to leakage current in said at least one additional device.

10. The voltage regulation circuit of claim 9,
- said second reference voltage generator comprising a pull-down field effect transistor electrically connected in series between an output node and a diode-connected field effect transistor,
- said pull-down field effect transistor having a gate that receives said variable first reference voltage,
- said pull-down field effect transistor being off when said variable first reference voltage is low such that said variable second reference voltage at said output node is high, and
- said pull-down field effect transistor being on when said variable first reference voltage is high such that said variable second reference voltage at said output node is pulled low.

11. The voltage regulation circuit of claim 9, said leakage condition being a function of operating temperature and process variations.

12. The voltage regulation circuit of claim 9, said at least one memory cell comprising one of a static random access memory (SRAM) cell and a dynamic random access memory (DRAM) cell.

13. The voltage regulation circuit of claim 9,
- said supply voltage being selectively variable between at least a low supply voltage and a high supply voltage that is greater than said low supply voltage, and
- said variable second reference voltage varying as a function of said leakage condition by a first voltage difference between high and low leakage conditions when said voltage regulation circuit operates at said low supply voltage and by a second voltage difference that is greater than said first voltage difference when said voltage regulation circuit operates at said high supply voltage.

14. The voltage regulation circuit of claim 9, said supply voltage comprising a positive supply voltage and said first reference voltage generator comprising:
- a first output node;
- at least one field effect transistor electrically connected in series between said positive supply voltage and said first output node, each field effect transistor having a P-type conductivity and being diode-connected; and a resistor electrically connected between said first output node and ground, said variable first reference voltage being generated at said first output node.

15. The voltage regulation circuit of claim 14, said second reference voltage generator comprising:
- a first intermediate node electrically connected to a second output node, said variable second reference voltage being generated at said second output node;
- at least one first field effect transistor electrically connected in series between said positive supply voltage and said first intermediate node, each first field effect transistor having a P-type conductivity and comprising a first gate, a first source and a first drain, said first gate being electrically connected to any one of said first output node and ground;
- at least one second field effect transistor electrically connected in series between said ground and said first intermediate node, each second field effect transistor having an N-type conductivity and comprising a second gate, a second source and a second drain, said second drain being electrically connected to said second gate such that said second field effect transistor is diode-connected;
- at least one third field effect transistor electrically connected in series between said positive supply voltage and said second output node, each third field effect transistor having said P-type conductivity and comprising a third gate, a third source and a third drain, said third gate being electrically connected to said second output node; and,
- a plurality of fourth field effect transistors electrically connected in series between ground and said second output node, said fourth field effect transistors each having said N-type conductivity and each comprising a fourth gate, a fourth source and a fourth drain, said plurality of fourth field effect transistors comprising: one fourth field effect transistor having said fourth drain directly connected to said second output node and said fourth gate electrically connected to said first output node; and at least one additional fourth field effect transistor having said fourth drain electrically connected to said fourth gate such that said at least one additional fourth field effect transistor is diode-connected.

16. The voltage regulation circuit of claim 15, said digital signal generator comprising:
- at least one fifth field effect transistor electrically connected in series between said positive supply voltage and a second intermediate node, each fifth field effect transistor having said P-type conductivity and comprising a fifth gate, a fifth source and a fifth drain, said fifth gate being electrically connected to any one of said first output node and ground;
- at least one sixth field effect transistor electrically connected in series between ground and said second intermediate node, each sixth field effect transistor having said N-type conductivity and comprising a sixth gate, a sixth source and a sixth drain, said sixth drain being electrically connected to said sixth gate such that said sixth field effect transistor is diode-connected;
- a third intermediate node electrically connected to said second intermediate node;
- a plurality of seventh field effect transistors electrically connected in series between ground and said third intermediate node, each seventh field effect transistor having said N-type conductivity and comprising a seventh gate, a seventh source and a seventh drain, said plurality of seventh field effect comprising: one seventh field effect transistor having said seventh drain directly connected to said third intermediate node and said seventh gate electrically connected to said first output node; and at least one additional seventh field effect transistor having said seventh drain electrically connected to said seventh gate such that said at least one additional seventh field effect transistor is diode-connected; and,
- a Schmitt trigger device having an input and an output, said input being electrically connected to said third intermediate node.

17. A voltage regulation method comprising:
providing a voltage regulation circuit;
generating, by a first reference voltage generator in said voltage regulation circuit, a variable first reference voltage, said variable first reference voltage being closer to a supply voltage when a leakage condition is high as compared to when said leakage condition is low; and,
generating, by a second reference voltage generator in said voltage regulation circuit, a variable second reference voltage using said variable first reference voltage and said supply voltage, said variable second reference voltage being closer to said supply voltage when said leakage condition is low as compared to when said leakage condition is high;
controlling a pre-charge device in said voltage regulation circuit using a pre-charge command signal, said pre-charge command signal comprising causing said pre-charge device to turn on and pre-charge a voltage line toward said supply voltage, said voltage line supplying power to at least one additional device; and,
controlling a power gate device in said voltage regulation circuit using said variable second reference voltage, said variable second reference voltage causing said power gate device to turn on when an actual voltage on said voltage line is less than a difference between said variable second reference voltage and a threshold voltage of said power gate device so as to limit voltage changes on said voltage line due to leakage current in said at least one additional device.

18. The voltage regulation method of claim 17, said leakage condition being a function of operating temperature and process variations and said at least one memory cell comprising one of a static random access memory (SRAM) cell and a dynamic random access memory (DRAM) cell.

19. The voltage regulation method of claim 17, further comprising selectively vary said supply voltage between at least a low supply voltage and a high supply voltage that is greater than said low supply voltage, said variable second reference voltage varying as a function of said leakage condition by a first voltage difference between high and low leakage conditions when said voltage regulation circuit operates at said low supply voltage and by a second voltage difference that is greater than said first voltage difference when said voltage regulation circuit operates at said high supply voltage.

20. The voltage regulation method of claim 17, said method further comprising generating said pre-charge command signal such that said pre-charge device will turn on to pull said voltage line toward said supply voltage whenever said leakage condition is low and, thereby such that said actual voltage on said voltage line can only be pulled away from said supply voltage by said at least one additional device when said leakage condition is high and said power gate device can only turn on when said leakage condition is high.

* * * * *